(12) United States Patent  (10) Patent No.: US 7,364,376 B2
Sugimoto et al.  (45) Date of Patent:  Apr. 29, 2008

(54) SUBSTRATE PROCESSING APPARATUS

(75) Inventors: Kenji Sugimoto, Kyoto (JP); Kenji Kamei, Kyoto (JP)

(73) Assignee: Dainippon Screen MFG. Co., Ltd. (JP)

( * ) Notice: Subject to any disclaimer, the term of this patent is extended or adjusted under 35 U.S.C. 154(b) by 739 days.

(21) Appl. No.: 10/846,874

(22) Filed: May 13, 2004

(65) Prior Publication Data

US 2004/0229441 A1  Nov. 18, 2004

(30) Foreign Application Priority Data

May 13, 2003  (JP) .............................. 2003-134240

(51) Int. Cl.
  *G03D 5/00*  (2006.01)
(52) U.S. Cl. ..................................... 396/611
(58) Field of Classification Search ................ 396/571, 396/575, 611; 438/5
  See application file for complete search history.

(56) References Cited

U.S. PATENT DOCUMENTS

| 6,022,672 | A | 2/2000 | Ikeda |
| 6,338,582 | B1 | 1/2002 | Ueda |
| 2002/0197746 | A1* | 12/2002 | Matsunaga et al. ............ 438/5 |
| 2003/0213431 | A1* | 11/2003 | Fukutomi et al. ........... 118/696 |

2004/0037677 A1  2/2004  Koyama et al.

FOREIGN PATENT DOCUMENTS

| JP | 7-142356 | 6/1995 |
| JP | 8-17724 | 1/1996 |
| JP | 8-255750 | 10/1996 |
| JP | 10-284413 | 10/1998 |
| JP | 2001-77014 | 3/2001 |
| JP | 2001-230201 | 8/2001 |
| JP | 2003-7587 | 1/2003 |
| JP | 2003-324139 | 11/2003 |
| JP | 2004-87570 | 3/2004 |
| JP | 2004-193597 | 7/2004 |

\* cited by examiner

*Primary Examiner*—W. B. Perkey
(74) *Attorney, Agent, or Firm*—Ostrolenk, Faber, Gerb & Soffen, LLP

(57) ABSTRACT

After an exposure process in an exposure part, the exposure part transmits an exposure completion signal to a main controller. At time (t12) which is a predetermined time interval (T12) later than an exposure completion time (t11), the main controller transmits a substrate transport signal to a heating part, to cause the transport of a substrate from a temporary substrate rest part to a heating plate and the start of a heating process by the heating plate. This provides substantially the same length of the time interval between the completion of the exposure process and the start of the heating process in the heating part, if there are variations in the time at which each substrate is placed on the temporary substrate rest part of the heating part.

6 Claims, 13 Drawing Sheets

F I G . 4A
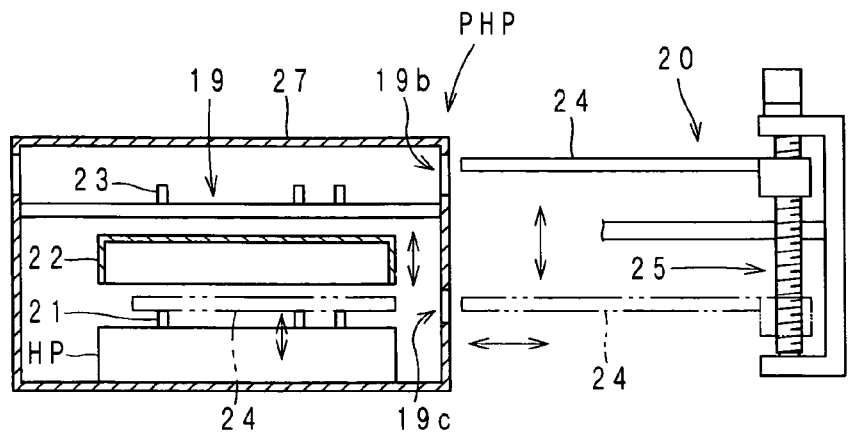
F I G . 4B
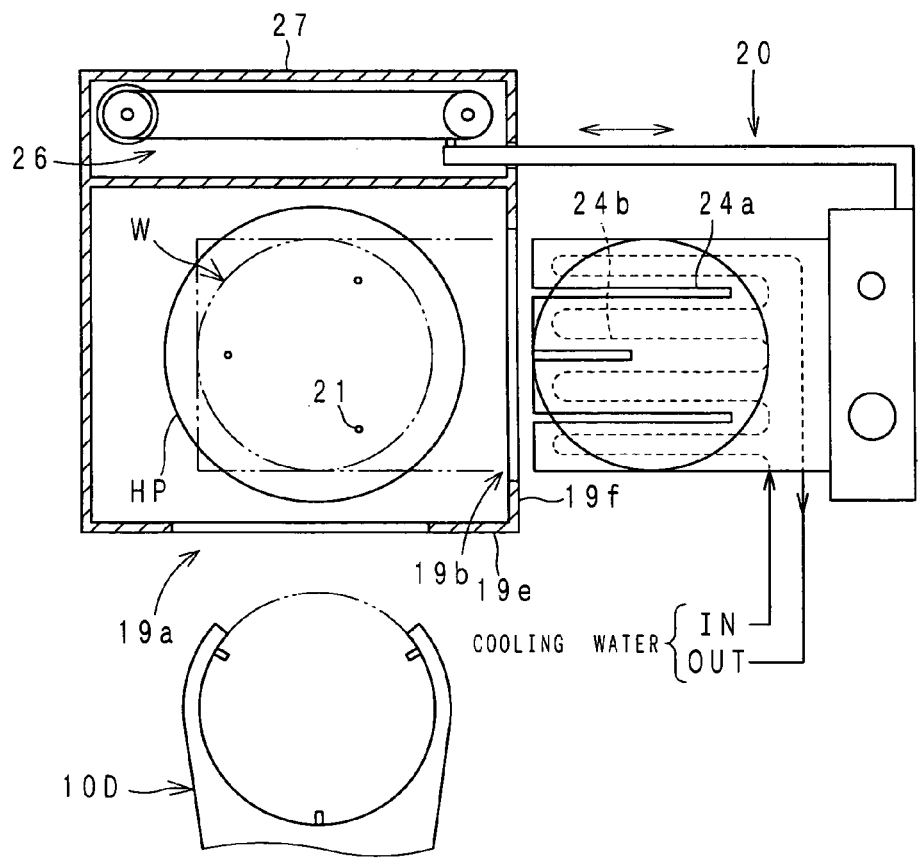

F I G . 9
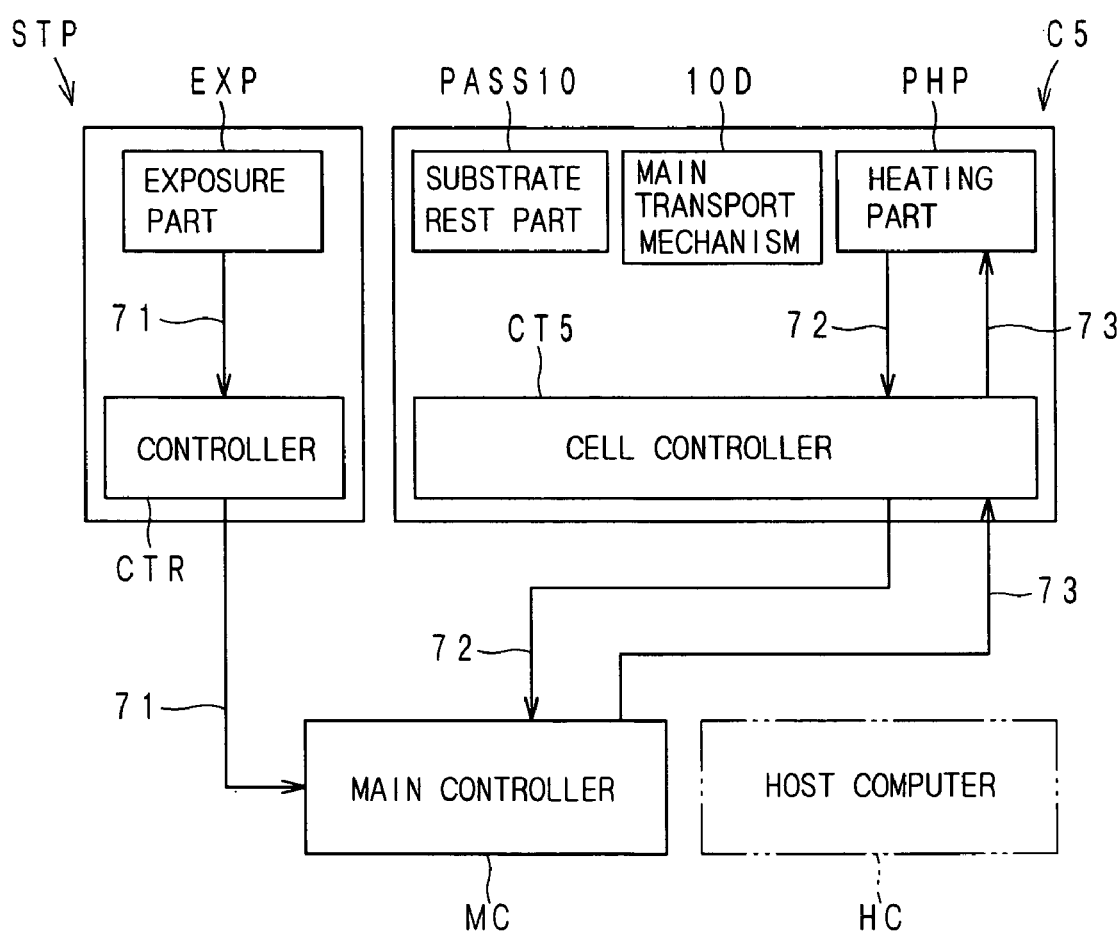

F I G . 1 3
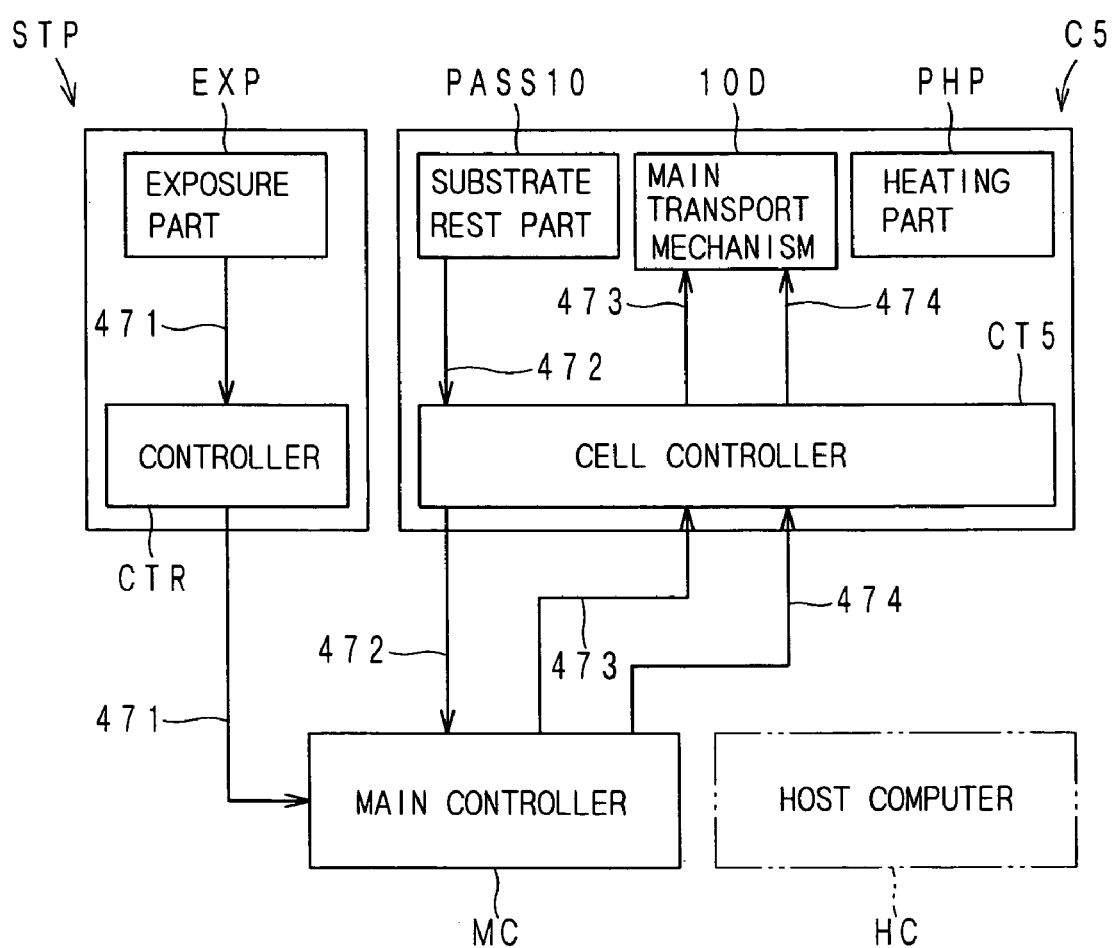

SUBSTRATE PROCESSING APPARATUS

BACKGROUND OF THE INVENTION

1. Field of the Invention

The present invention relates to a substrate processing apparatus for performing a series of processes upon substrates including a semiconductor substrate, a glass substrate for a liquid crystal display device, a glass substrate for a photomask, a substrate for an optical disc, and the like. More particularly, the present invention relates to an improvement in a controller for controlling the start timing of a thermal process of substrates subjected to an exposure process.

2. Description of the Background Art

With demands for higher density and higher degree of integration in the recent manufacture of semiconductor wafers, a technique has been required for size reduction of circuit patterns to be formed on the semiconductor wafers. To meet the requirement in the process steps of manufacturing semiconductor wafers, there has been proposed a technique which uses a chemically amplified resist as a photoresist to perform an exposure process, a thermal process and a development process on substrates coated with the chemically amplified resist, thereby to form patterns of a resist film on the substrates.

In the process of forming patterns in the resist film by using the chemically amplified resist, the exposure process is initially performed to direct light onto the resist film formed using the chemically amplified resist. This creates an acid catalyst in portions of the resist film exposed to the light, whereby patterns having a three-dimensional distribution are latent in the resist film. Next, when a heating process is performed on the substrates subjected to the exposure process, a chemical reaction which will cause a change in the rate of dissolution in a developing solution is activated by the catalytic action of the acid catalyst created in the exposed portions. Then, the chemical reaction substantially stops when a cooling process is performed on the substrates. The patterns of the resist film emerge onto the substrates when the development process is performed on the substrates.

However, in the above-mentioned process of forming the patterns in the resist film, the chemical reaction which will cause a change in the rate of dissolution in the developing solution is caused to proceed by the acid catalyst created in the resist film during a time interval between the completion of the exposure process and the start of the heating process.

For example, if variations in the length of time required to transport the substrates from an exposure part for performing the exposure process to a heating part for performing the heating process give rise to variations between the substrates in the length of time (also referred to hereinafter as "post-exposure delay time") from the completion of the exposure process to the start of the heating process, there arise variations in the amount of acid catalyst created in the resist film prior to the start of the heating process.

Thus, the conventional technique fails to bring the dimensional accuracy of line widths and the like of the patterns formed in the resist film within a predetermined range. This presents a problem such that the dimensional accuracy of interconnect patterns formed on the substrates is not within a predetermined range.

SUMMARY OF THE INVENTION

The present invention is intended for a substrate processing apparatus.

According to the present invention, the substrate processing apparatus comprises: a thermal processor for performing a thermal process on a substrate subjected to an exposure process; and a controller for causing the transport of each substrate to the thermal processor before a predetermined time interval has elapsed since the completion of the exposure process of each substrate and for causing the start of the thermal process of each substrate in the thermal processor when the predetermined time interval has elapsed since the completion of the exposure process, based on an exposure completion signal transmitted from an exposure part when the exposure process is completed, the thermal processor including a temporary substrate rest chamber in which is provided a temporary substrate rest part for placing the substrate thereon when the substrate is transferred to and received from an outside of the thermal processor, a heating chamber in which is provided a heating unit for heating the substrate subjected to the exposure process, the heating chamber and the temporary substrate rest chamber being disposed in stacked relationship with each other, and a first transport unit for holding and transporting the substrate between the temporary substrate rest part and the heating unit while cooling the substrate heated by the heating unit.

The substrate processing apparatus can make a plurality of substrates substantially the same in reaction status of a resist film the reaction of which is started by the exposure process, to improve the accuracy of line widths of interconnect patterns formed on the substrates. Additionally, each substrate is not supplied with heat emitted or transferred from the heating unit during the time interval between the completion of the exposure process and the start of the heating process in the thermal processor. This prevents the variations in the amount of acid catalyst created in the resist film in the thermal processor, thereby to make the line widths of the interconnect patterns in the resist film substantially the same.

Preferably, the controller adjusts a time interval during which the substrate rests on the temporary substrate rest part, thereby to control the start timing of the thermal process.

Therefore, the substrate processing apparatus can make a plurality of substrates substantially the same in the length of the time interval between the completion of the exposure process and the start of the thermal process.

It is therefore an object of the present invention to provide a substrate processing apparatus capable of bringing the dimensional accuracy of interconnect patterns formed in a resist film on a plurality of substrates within a predetermined range.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B show a temporary-rest-equipped heating part according to the present invention;

FIG. 9 is a block diagram showing control signals for an exposure apparatus, a post-exposure heating processing cell, and a main controller according to a first preferred embodiment of the present invention;

FIG. 13 is a block diagram showing control signals for the exposure apparatus, the post-exposure heating processing cell, and the main controller according to a fifth preferred embodiment of the present invention.

DESCRIPTION OF THE PREFERRED EMBODIMENTS

Preferred embodiments of the present invention will now be described in detail with reference to the drawings.

1. First Preferred Embodiment

<1.1. Construction of Substrate Processing Apparatus>

Figure 1:
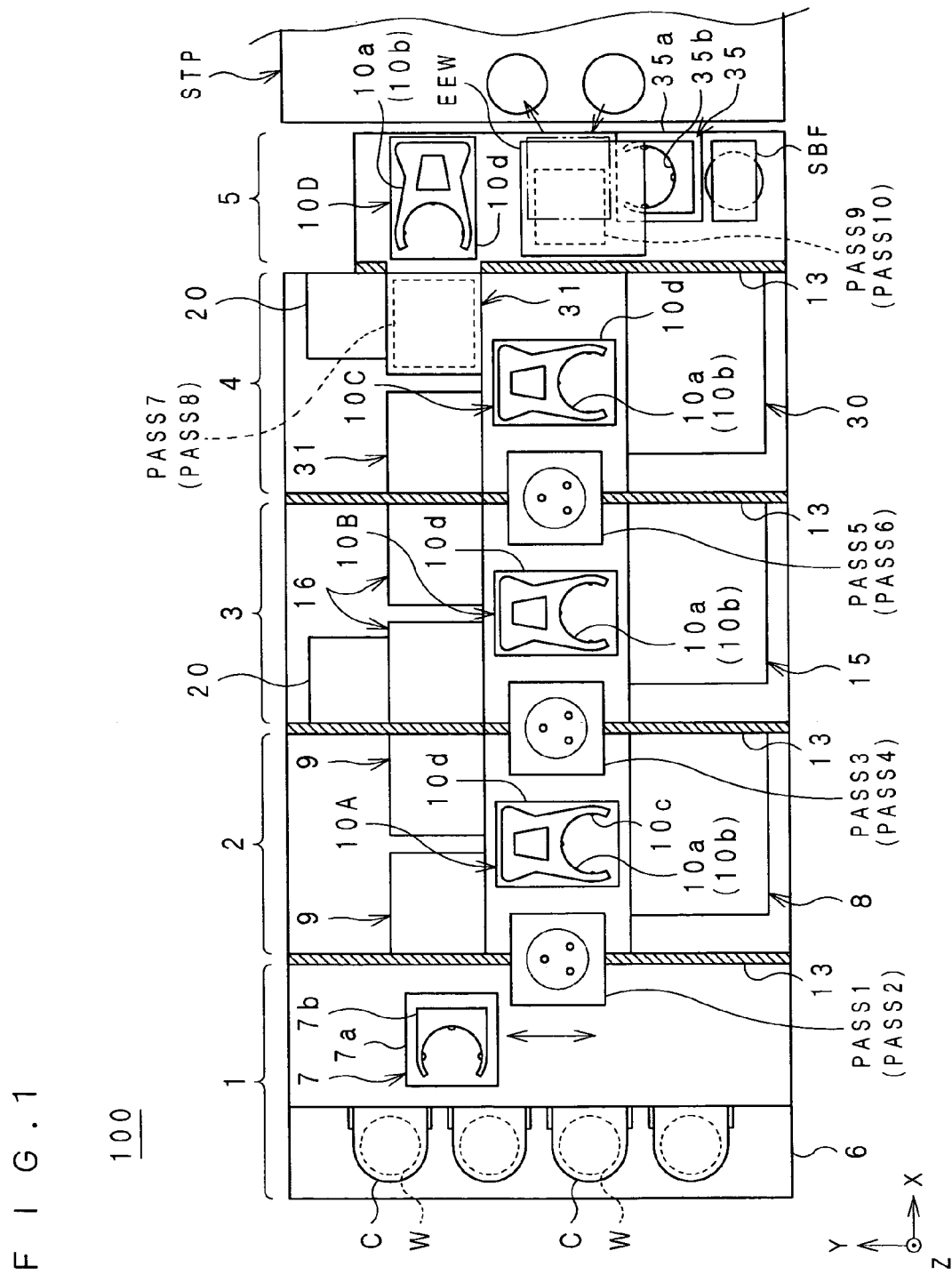
FIG. 1 is a schematic plan view showing the construction of a substrate processing apparatus according to the present invention.

FIG. 1 is a plan view of a substrate processing apparatus 100 according to a first preferred embodiment of the present invention. The substrate processing apparatus taken herein as an example is a substrate processing apparatus which forms an anti-reflection film and a photoresist film on substrates by coating and performs a chemical process such as a development process on exposed substrates. For the sake of definiteness of directions relative to each other, an XYZ rectangular coordinate system which defines the direction of the Z axis as the vertical direction and the X-Y plane as the horizontal plane is additionally shown, as appropriate, in FIG. 1 and its subsequent figures.

As shown in FIG. 1, the substrate processing apparatus 100 according to the first preferred embodiment principally comprises: an indexer block 1; three processing blocks (specifically, an anti-reflection film processing block 2, a resist film processing block 3, and a development processing block 4) for performing respective predetermined chemical processes on substrates; and an interface block 5. In the substrate processing apparatus 100, these blocks 1 to 5 are arranged in adjacent relation. An exposure apparatus (or stepper) STP which is an external apparatus separate from the substrate processing apparatus 100 of the first preferred embodiment is provided in adjacent relation to the interface block 5.

In the substrate processing apparatus 100, a predetermined supply part not shown supplies a downflow of clean air into each of the blocks 1 to 5 to thereby avoid the adverse effects of raised particles and gas flows upon the processes.

The interior of each of the blocks 1 to 5 is held at a slightly positive pressure relative to the exterior to prevent particles and contaminants from entering the blocks 1 to 5. In particular, the air pressure in the anti-reflection film processing block 2 is set at a pressure higher than that in the indexer block 1. This prevents the atmosphere in the indexer block 1 from flowing into the anti-reflection film processing block 2 to allow each processing block to perform its process without being influenced by the outside atmosphere.

The indexer block 1 is a block for receiving unprocessed substrates W from the outside of the substrate processing apparatus 100 and for transferring processed substrates W to the outside. The indexer block 1 comprises a cassette table 6 for placing thereon a plurality of (in FIG. 1, four) cassettes C in juxtaposition each capable of storing a predetermined number of substrates W in tiers, and an indexer-specific transport mechanism 7 for taking out the unprocessed substrates W in order from each of the cassettes C for post-stage processing and for receiving the processed substrates W to store the processed substrates W in order into each of the cassettes C.

Figure 2:
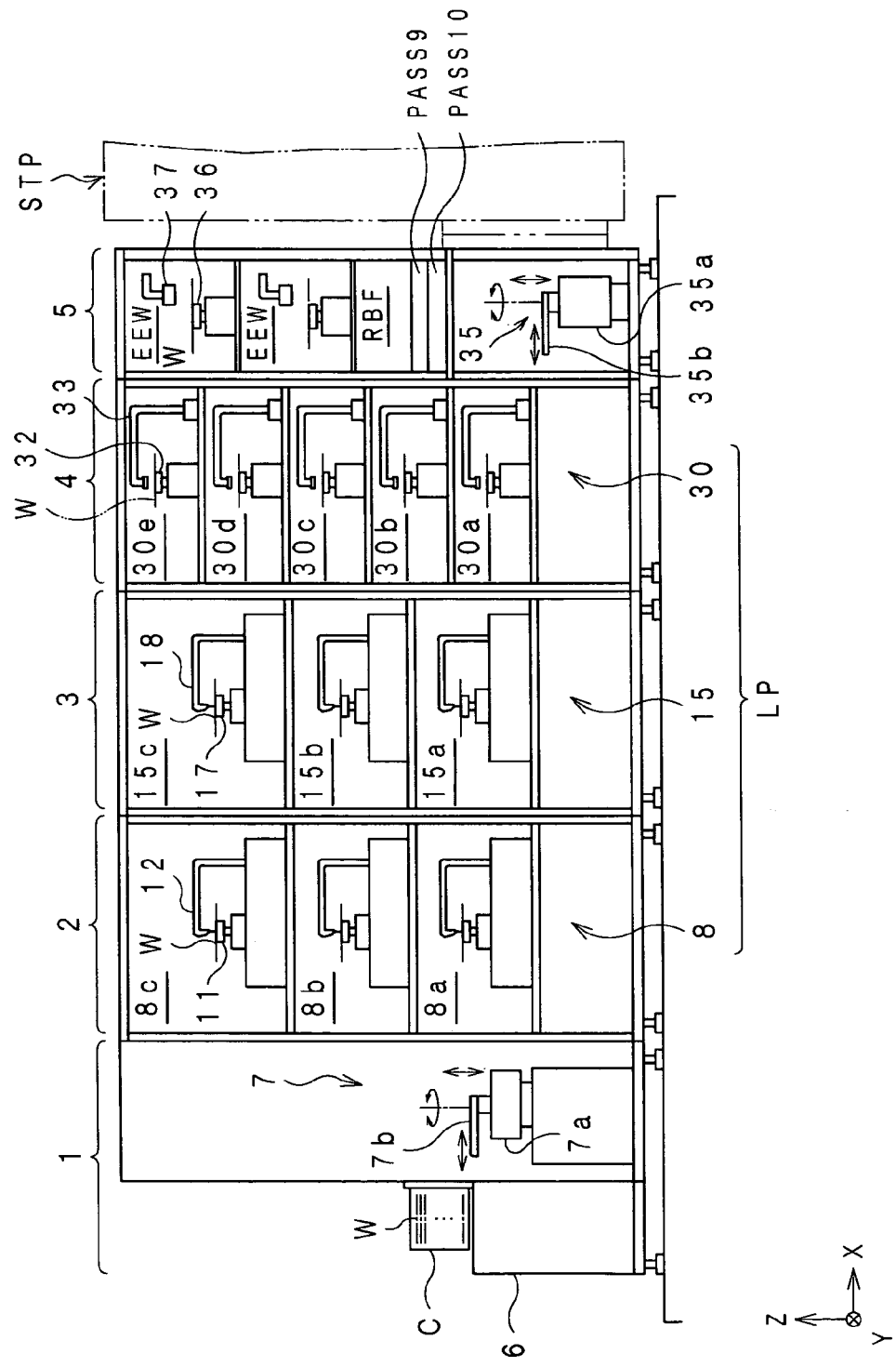
FIG. 2 is a schematic front view showing the construction of the substrate processing apparatus according to the present invention.

The indexer-specific transport mechanism 7 includes a movable base 7a movable horizontally in the Y direction along the cassette table 6, a holding arm 7b provided over the movable base 7a and for holding a substrate W in a horizontal position, and a plurality of (in FIG. 1, three) pins 10c projecting inwardly of a distal end portion of the holding arm 7b (See FIG. 2). The holding arm 7b is capable of moving vertically in the Z direction, pivoting within a horizontal plane and moving back and forth in the direction of the pivot radius. The substrate W is held in the horizontal position by the pins 10c.

As illustrated in FIG. 1, a partition 13 is provided on the boundary between the indexer block 1 and the anti-reflection film processing block 2 adjacent to the indexer block 1 for the purpose of closing off the communication of atmosphere between the indexer block 1 and the anti-reflection film processing block 2. A pair of vertically arranged substrate rest parts PASS1 and PASS2 each for placing a substrate W thereon extend through the partition 13.

The transfer of substrates W in the indexer block 1 will be briefly described. First, the indexer-specific transport mechanism 7 moves horizontally to a position opposed to a predetermined cassette C. Then, the holding arm 7b moves vertically and moves back and forth to take out an unprocessed substrate W from the cassette C. With the substrate W held by the holding arm 7b, the indexer-specific transport mechanism 7 moves horizontally to a position opposed to the substrate rest parts PASS1 and PASS2 to be described later.

The indexer-specific transport mechanism 7 places the substrate W held on the holding arm 7b onto the upper substrate rest part PASS1 provided for outward transfer of substrates. If a processed substrate W is placed on the lower substrate rest part PASS2 provided for return of substrates, the indexer-specific transport mechanism 7 receives the processed substrate W onto the holding arm 7b to store the processed substrate W into a predetermined cassette C. Subsequently, the indexer-specific transport mechanism 7 repeats the operation of taking out an unprocessed substrate W from a cassette C to transport the unprocessed substrate W to the substrate rest part PASS1 and the operation of receiving a processed substrate W from the substrate rest part PASS2 to store the processed substrate W into a cassette C.

Figure 3:
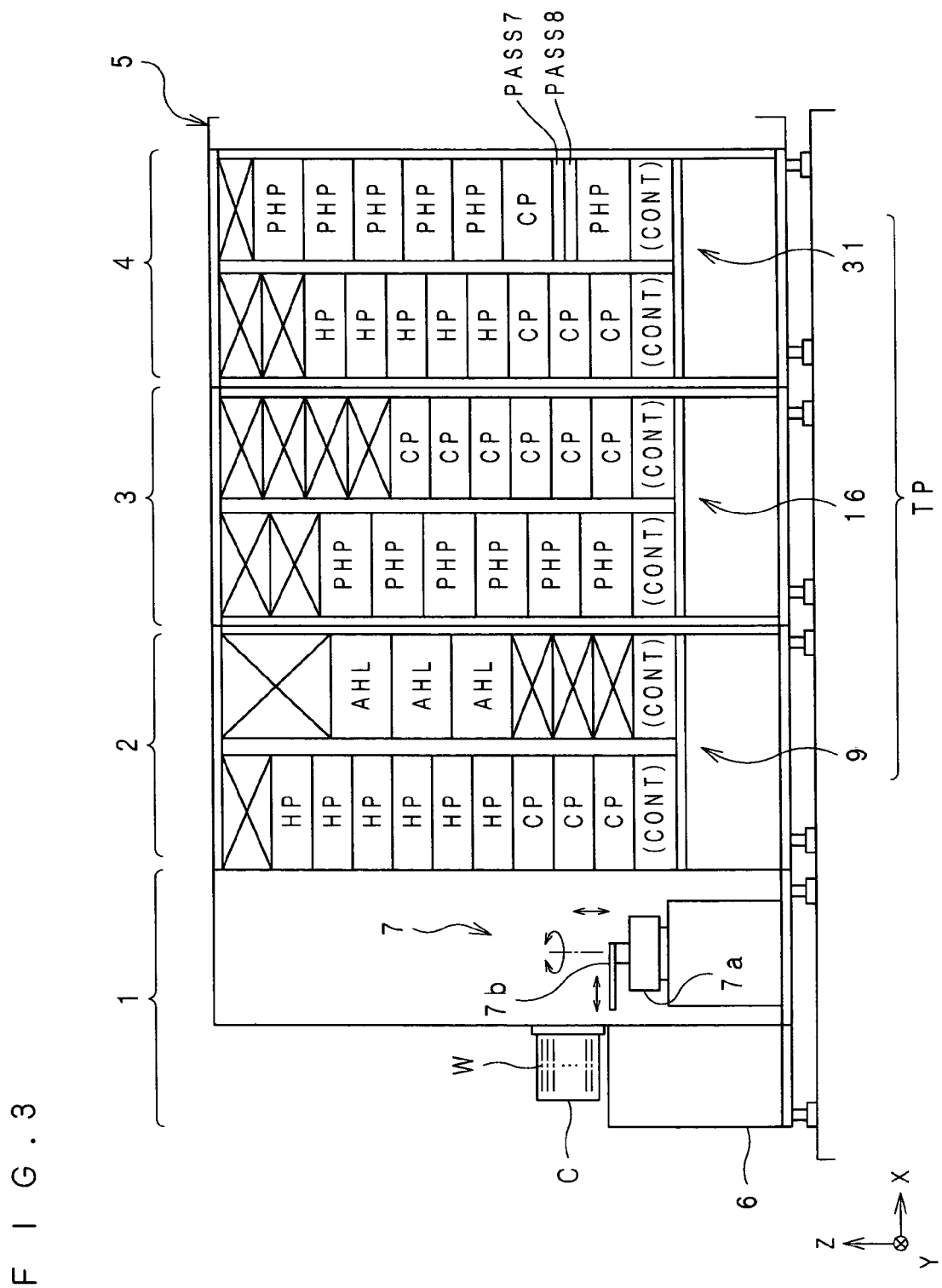
FIG. 3 shows the arrangement of a thermal processor according to the present invention.

FIG. 2 is a front view of the substrate processing apparatus 100. FIG. 3 shows the arrangement of a thermal processor TP as seen in the same direction as in FIG. 2. The anti-reflection film processing block 2 performs the process of forming an anti-reflection film for reducing standing waves or halation occurring during the exposure in the exposure apparatus STP under a photoresist film. The anti-reflection film processing block 2 comprises a first coating processor 8 (including coating processing units 8a to 8c) for coating a surface of a substrate W with the anti-reflection film, a first thermal processor 9 (including a plurality of heating plates HP, a plurality of cooling units CP and a plurality of adhesion processing units AHL) for performing a thermal process required for the coating, and a first main transport mechanism 10A for transferring and receiving a substrate W to and from the first coating processor 8 and the first thermal processor 9.

The main transport mechanism 10A is a transport robot similar in hardware construction to main transport mechanisms 10B to 10D to be described later. The main transport mechanism 10A includes a base 10d, and two (upper and lower) holding arms 10a and 10b (only one of which is shown in FIG. 1) which are provided on the base 10d. Each of the holding arms 10a and 10b has a substantially C-shaped distal end portion, and a plurality of (in FIG. 1, three) pins 10c projecting inwardly of the distal end portion can hold a substrate W in a horizontal position. The holding arms 10a and 10b are driven by a driving mechanism not shown to pivot within a horizontal plane, to move vertically in the Z direction and to move back and forth in the direction of the pivot radius.

As illustrated in FIG. 1, a partition 13 is provided on the boundary between the anti-reflection film processing block 2 and the resist film processing block 3 adjacent to the anti-reflection film processing block 2 for the purpose of closing off the communication of atmosphere between the anti-reflection film processing block 2 and the resist film processing block 3. A pair of vertically arranged substrate rest parts PASS3 and PASS4 each for placing a substrate W thereon extend through the partition 13. Specifically, the substrate rest parts PASS3 and PASS4 are rest parts used for transfer of substrates W between the first main transport mechanism 10A of the anti-reflection film processing block 2 and the second main transport mechanism 10B of the resist film processing block 3. The upper substrate rest part PASS3 is used for outward transfer of substrates, and the lower substrate rest part PASS4 is used for return of substrates.

A substrate W subjected to the process of forming the anti-reflection film in the anti-reflection film processing block 2 is placed onto the upper substrate rest part PASS3 by the first main transport mechanism 10A. The substrate W placed on the substrate rest part PASS3 is transported into the resist film processing block 3 by the second main transport mechanism 10B of the resist film processing block 3. A substrate W subjected to an exposure process, a post-exposure bake process and a development process in the exposure apparatus STP and the development processing block 4 is placed onto the lower substrate rest part PASS4 by the second main transport mechanism 10B. The substrate W placed on the substrate rest part PASS4 is transported into the anti-reflection film processing block 2 by the first main transport mechanism 10A of the anti-reflection film processing block 2. Thus, the transfer of substrates W between the anti-reflection film processing block 2 and the resist film processing block 3 is carried out through the substrate rest parts PASS3 and PASS4.

In the anti-reflection film processing block 2, the first coating processor 8 and the first thermal processor 9 are arranged on opposite sides of the first main transport mechanism 10A, the first coating processor 8 being on the front side of the apparatus 100, the first thermal processor 9 being on the rear side of the apparatus 100. This arrangement suppresses the thermal effect of the first thermal processor 9 upon the first coating processor 8. Additionally, a thermal barrier not shown is provided on the front side of the first thermal processor 9 (or on the first main transport mechanism 10A side) to avoid the thermal effect on the first coating processor 8.

The resist film processing block 3 is responsible for the process of forming the photoresist film on substrates W formed with the anti-reflection film. In this preferred embodiment, a chemically amplified resist is used as the photoresist. The resist film processing block 3 comprises a second coating processor 15 (including coating processing units 15a to 15c) for coating with the photoresist film, a second thermal processor 16 (including a plurality of heating parts PHP and a plurality of cooling units CP) for performing a thermal process required for the coating, and the second main transport mechanism 10B for transferring and receiving a substrate W to and from the second coating processor 15 and the second thermal processor 16.

As illustrated in FIG. 1, a partition 13 is provided on the boundary between the resist film processing block 3 and the development processing block 4 adjacent to the resist film processing block 3 for the purpose of closing off the communication of atmosphere between the resist film processing block 3 and the development processing block 4. A pair of vertically arranged substrate rest parts PASS5 and PASS6 each for placing a substrate W thereon extend through the partition 13. Specifically, the substrate rest parts PASS5 and PASS6 are rest parts used for transfer of substrates W between the second main transport mechanism 10B of the resist film processing block 3 and the third main transport mechanism 10C of the development processing block 4. The upper substrate rest part PASS5 is used for outward transfer of substrates, and the lower substrate rest part PASS6 is used for return of substrates.

A substrate W subjected to the resist coating process in the resist film processing block 3 is placed onto the upper substrate rest part PASS5 by the second main transport mechanism 10B. The substrate W placed on the substrate rest part PASS5 is transported into the development processing block 4 by the third main transport mechanism 10C of the development processing block 4. A substrate W subjected to the exposure process, the post-exposure bake process and the development process in the exposure apparatus STP and the development processing block 4 is placed onto the lower substrate rest part PASS6 by the third main transport mechanism 10C. The substrate W placed on the substrate rest part PASS6 is transported into the resist film processing block 3 by the second main transport mechanism 10B of the resist film processing block 3. Thus, the transfer of substrates W between the resist film processing block 3 and the development processing block 4 is carried out through the substrate rest parts PASS5 and PASS6.

In the resist film processing block 3, the second coating processor 15 and the second thermal processor 16 are arranged on opposite sides of the second main transport mechanism 10B, the second coating processor 15 being on the front side of the apparatus 100, the second thermal processor 16 being on the rear side of the apparatus 100. This arrangement suppresses the thermal effect of the second thermal processor 16 upon the second coating processor 15, as in the anti-reflection film processing block 2. Additionally, a thermal barrier not shown is provided on the front side of the second thermal processor 16 (or on the second main transport mechanism 10B side) to avoid the thermal effect on the second coating processor 15.

The development processing block 4 is a mechanism for performing the development process on substrates W exposed in a predetermined circuit pattern by the exposure apparatus STP. The development processing block 4 comprises a development processor 30 for performing the development process using a developing solution, a third thermal processor 31 for performing a thermal process required for the development process, and the third main transport mechanism 10C for transferring and receiving a substrate W to and from the development processor 30 and the third thermal processor 31.

The development processor 30 includes five development processing units 30a to 30e arranged in vertically stacked relation and similar in construction to each other, as illustrated in FIG. 2. Each of the development processing units 30a to 30e includes a spin chuck 32 for rotating a substrate W while holding the substrate W in a horizontal position under suction, and a nozzle 33 for supplying the developing solution onto the substrate W held on the spin chuck 32.

As illustrated in FIG. 3, the third thermal processor 31 includes thermal processing parts such as a plurality of heating plates HP, a plurality of temporary-rest-equipped heating parts PHP, and a plurality of cooling units CP each for cooling a substrate W to room temperature with high precision. These thermal processing parts are arranged in vertical stacks adjacent to each other.

FIGS. 4A and 4B schematically show the construction of a temporary-rest-equipped heating part PHP. The heating part PHP comprises a heating plate (heating unit) HP for heating a substrate W placed thereon, a temporary substrate rest part 19 for placing a substrate W in an upper or lower position (in this preferred embodiment, an upper position) spaced apart from the heating plate HP, and a local transport mechanism 20 specific to a thermal processing part for transporting a substrate W between the heating plate HP and the temporary substrate rest part 19.

The interior space of the heating part PHP (or the space defined by an enclosure 27) includes a temporary substrate rest chamber in which the temporary substrate rest part 19 is disposed, and a heating chamber in which the heating plate HP is disposed. The temporary substrate rest chamber is stacked on top of the heating chamber.

The heating plate HP is provided with a plurality of movable support pins 21 extendable out of and retractable into the plate surface. A vertically movable top cover 22 for covering a substrate W during the heating process is provided over the heating plate HP. The temporary substrate rest part 19 is provided with a plurality of fixed support pins 23 for supporting a substrate W.

The local transport mechanism 20 includes a holding plate 24 for holding a substrate W in a substantially horizontal position. The holding plate 24 is moved vertically by a screw feed drive mechanism 25, and is moved back and forth by a belt drive mechanism 26. The holding plate 24 is provided with a plurality of slits 24a so as not to interfere with the movable support pins 21 and the fixed support pins 23 when the holding plate 24 moves to over the heating plate HP and the temporary substrate rest part 19. The local transport mechanism 20 includes a cooling unit for cooling a substrate W in the course of the transport of the substrate W from the heating plate HP to the temporary substrate rest part 19.

As illustrated in FIG. 4B, the cooling unit may be constructed so that a cooling water passage 24b through which a cooling water flows is provided inside the holding plate 24. Alternatively, the cooling unit may be designed to cool the holding plate 24 by heat conduction from the holding plate 24 to a cooling device (not shown) provided in contact with the holding plate 24, thereby cooling a substrate W by heat conduction from the substrate W to the holding plate 24 when the substrate W is held by the cooled holding plate 24.

The above-mentioned local transport mechanism 20 is opposed to a surface 19f adjacent to a surface 19e (See FIG. 4B) opposed to the fourth main transport mechanism 10D of the interface block 5. In an upper portion of the enclosure 27 covering the heating plate HP and the temporary substrate rest part 19, i.e., a portion of the enclosure 27 which covers the temporary substrate rest part 19, the surface 19e is provided with an opening 19a for allowing the fourth main transport mechanism 10D to enter the enclosure 27, and the surface 19f is provided with an opening 19b for allowing the local transport mechanism 20 to enter the enclosure 27. In a lower portion of the enclosure 27 which covers the heating plate HP, the surface 19e is provided with no openings, and the surface 19f is provided with an opening 19c for allowing the local transport mechanism 20 to enter the enclosure 27.

A substrate W is carried into and out of the above-mentioned heating part PHP in a manner to be described below. First, the fourth main transport mechanism 10D holds a substrate W, and places the substrate W onto the fixed support pins 23 of the temporary substrate rest part 19. Subsequently, the holding plate 24 of the local transport mechanism 20 moves to under the substrate W, and then moves slightly upwardly to receive the substrate W from the fixed support pins 23. The holding plate 24 which holds the substrate W moves backwardly out of the enclosure 27, and moves downwardly to a position opposed to the heating plate HP. At this time, the movable support pins 21 of the heating plate HP are in a lowered heating position in which the lower surface of the substrate W contacts the upper surface of the holding plate 24, and the top cover 22 is in a raised position. The holding plate 24 which holds the substrate W moves to over the heating plate HP. After the movable support pins 21 move upwardly and receive the substrate W in a receiving position, the holding plate 24 moves backwardly out of the enclosure 27. Subsequently, the movable support pins 21 move downwardly to place the substrate W onto the heating plate HP, and the top cover 22 moves downwardly to cover the substrate W. In this state, the substrate W is subjected to the heating process. After the heating process, the top cover 22 moves upwardly, and the movable support pins 21 move upwardly to lift the substrate W. Next, after the holding plate 24 moves to under the substrate W, the movable support pins 21 move downwardly to transfer the substrate W to the holding plate 24. The holding plate 24 which holds the substrate W moves backwardly out of the enclosure 27, and then moves upwardly to transport the substrate W to the temporary substrate rest part 19. The substrate W supported by the holding plate 24 within the temporary substrate rest chamber is cooled by the cooling function of the holding plate 24. The holding plate 24 brings the substrate W cooled (to room temperature) onto the fixed support pins 23 of the temporary substrate rest part 19. The fourth main transport mechanism 10D takes out and transports the substrate W.

As discussed above, the fourth main transport mechanism 10D transfers and receives the substrate W to and from only the temporary substrate rest part 19, but does not transfer and receive the substrate W to and from the heating plate HP. This avoids the temperature rise of the fourth main transport mechanism 10D.

A pair of substrate rest parts PASS7 and PASS8 vertically arranged close to each other for transfer of substrates W between the third main transport mechanism 10C of the development processing block 4 and the fourth main transport mechanism 10D of the interface block 5 are provided in the right-hand stack (adjacent to the interface block 5) of thermal processing parts of the third thermal processor 31. The upper substrate rest part PASS7 is used for outward transfer of substrates, and the lower substrate rest part PASS8 is used for return of substrates.

A substrate W transported from the resist film processing block 3 into the development processing block 4 is placed onto the substrate rest part PASS7 by the third main transport mechanism 10C. The substrate W placed on the substrate rest part PASS7 is transported into the interface block 5 by the fourth main transport mechanism 10D of the interface block 5. A substrate W subjected to the exposure process in the exposure apparatus STP is placed onto the substrate rest part PASS8 by the fourth main transport mechanism 10D. The substrate W placed on the substrate rest part PASS8 is transported into the development processing block 4 by the third main transport mechanism 10C of the development processing block 4. Thus, the transfer of substrates W between the development processing block 4 and the interface block 5 is carried out through the substrate rest parts PASS7 and PASS8.

In the development processing block 4, the development processor 30 and the third thermal processor 31 are arranged on opposite sides of the third main transport mechanism 10C, the development processor 30 being on the front side of the apparatus 100, the third thermal processor 31 being on the rear side of the apparatus 100. This arrangement suppresses the thermal effect of the third thermal processor 31 upon the development processor 30, as in the anti-reflection film processing block 2 and the resist film processing block 3. Additionally, a thermal barrier not shown is provided on the front side of the third thermal processor 31 (or on the third main transport mechanism 10C side) to avoid the thermal effect on the development processor 30.

The interface block 5 is a mechanism for the transfer of substrates W to and from the exposure apparatus STP which is an external apparatus separate from the substrate processing apparatus 100. The interface block 5 in the substrate processing apparatus 100 principally comprises: an interface-specific transport mechanism 35 for transferring and receiving a substrate W to and from the exposure apparatus STP; two edge exposure units EEW for exposing the periphery of a substrate W coated with the photoresist; and the fourth main transport mechanism 10D for transferring and receiving a substrate W to and from the temporary-rest-equipped heating parts PHP provided in the development processing block 4 and the edge exposure units EEW.

As shown in FIG. 2, each of the edge exposure units EEW includes a spin chuck 36 for rotating a substrate W while holding the substrate W in a horizontal position under suction, and a light irradiator 37 for exposing the periphery of the substrate W held on the spin chuck 36 to light. The two edge exposure units EEW are arranged in vertically stacked relation in the center of the interface block 5.

Figure 5:
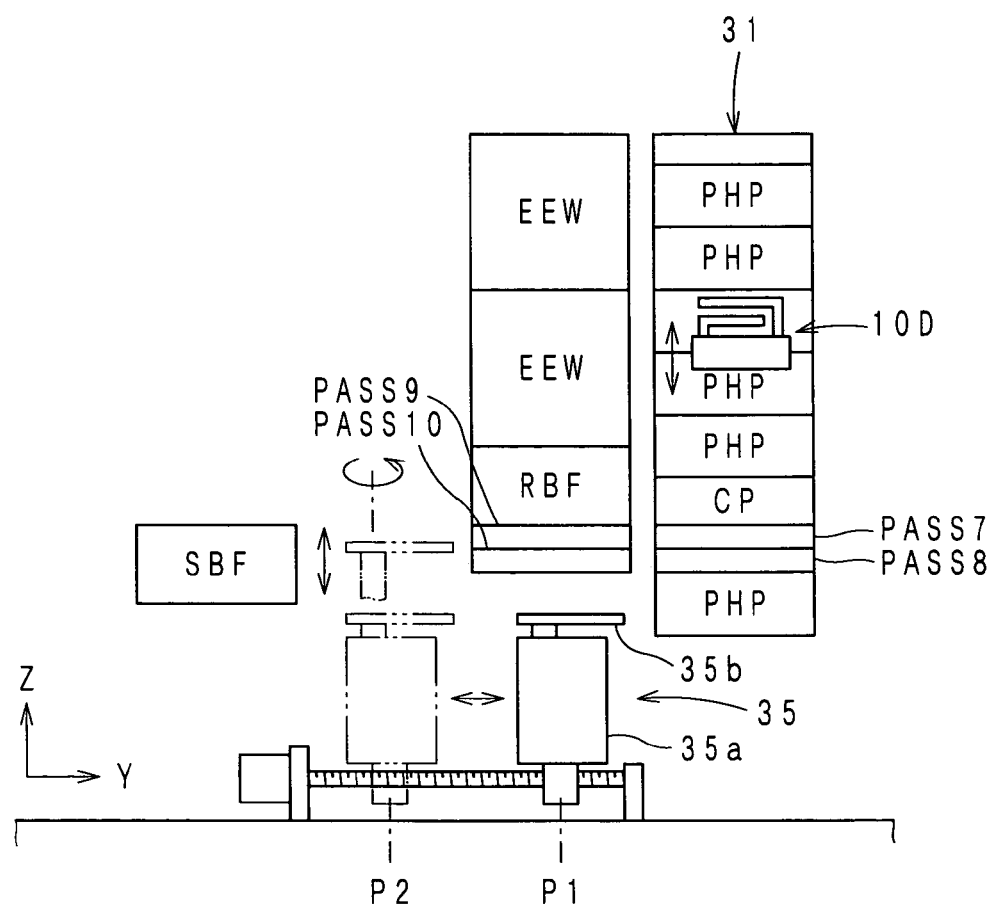
FIG. 5 is a schematic side view showing the construction of an interface block according to the present invention.

FIG. 5 is a side view of the interface block 5. A return buffer RBF for return of substrates is provided under the two edge exposure units EEW, and a pair of vertically arranged substrate rest parts PASS9 and PASS10 are provided under the return buffer RBF. The return buffer RBF is provided to temporarily store a substrate W subjected to the post-exposure heating process in the heating part PHP of the development processing block 4 if the development processing block 4 cannot perform the development process on the substrate W because of a malfunction and the like. The return buffer RBF includes a cabinet capable of storing a plurality of substrates W in tiers. The substrate rest parts PASS9 and PASS10 are rest parts used for transfer of substrates W between the fourth main transport mechanism 10D and the interface-specific transport mechanism 35. The upper substrate rest part PASS9 is used for outward transfer of substrates, and the lower substrate rest part PASS 10 is used for return of substrates.

As shown in FIGS. 1 and 5, the interface-specific transport mechanism 35 includes a movable base 35a movable horizontally in the Y direction, and a holding arm 35b provided over the movable base 35a and for holding a substrate W. The holding arm 35b is capable of moving vertically, pivoting and moving back and forth in the direction of the pivot radius. The transport path of the interface-specific transport mechanism 35 extends at one end (a position P1 shown in FIG. 5) to under the stacked substrate rest parts PASS9 and PASS10. In the position P1, a substrate W is transferred to and from the exposure apparatus STP. In the opposite end position P2 of the transport path, a substrate W is transferred to and from the substrate rest parts PASS9 and PASS10, and also is stored into and taken out of a feed buffer SBF. The feed buffer SBF is provided to temporarily store a substrate W prior to the exposure process if the exposure apparatus STP cannot accept the substrate W, and includes a cabinet capable of storing a plurality of substrates W in tiers.

<1.2. Control of Substrate Processing Apparatus>

Figure 6:
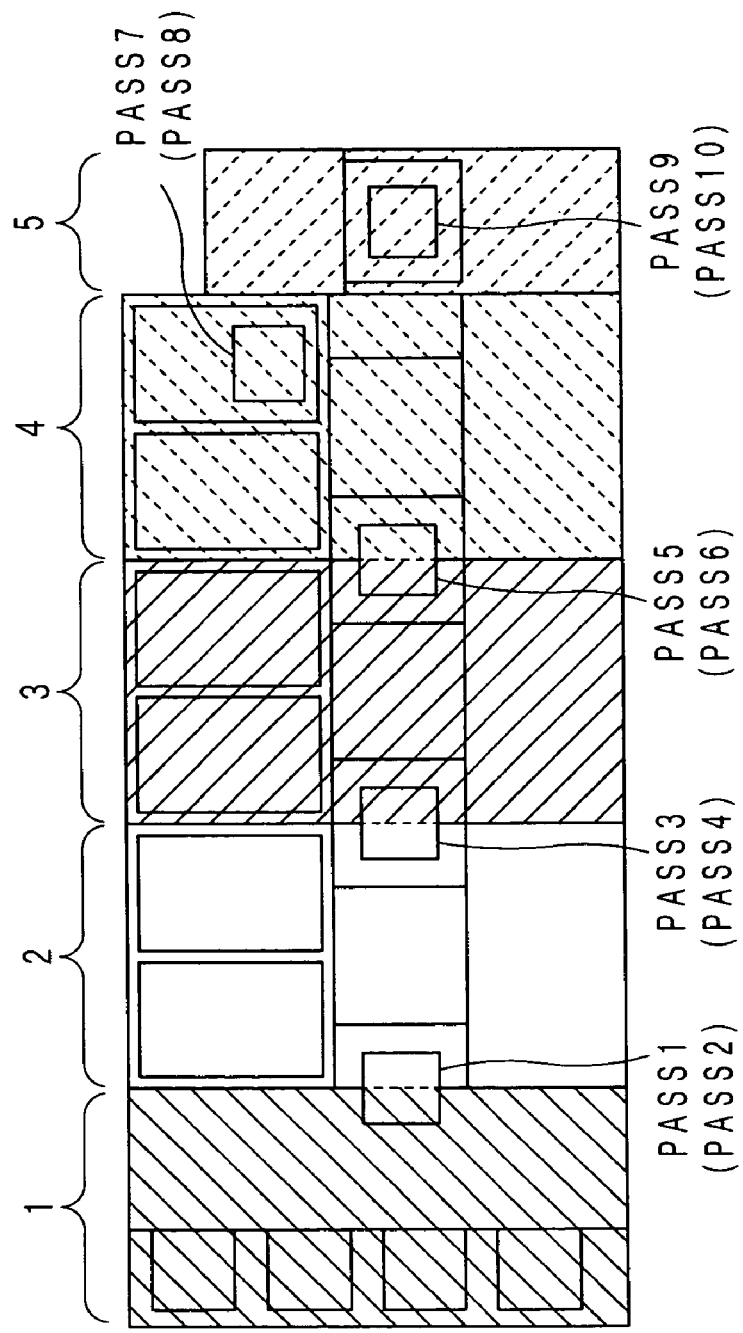
FIG. 6 is a plan view showing a block arrangement in the substrate processing apparatus according to the present invention.
Figure 7:
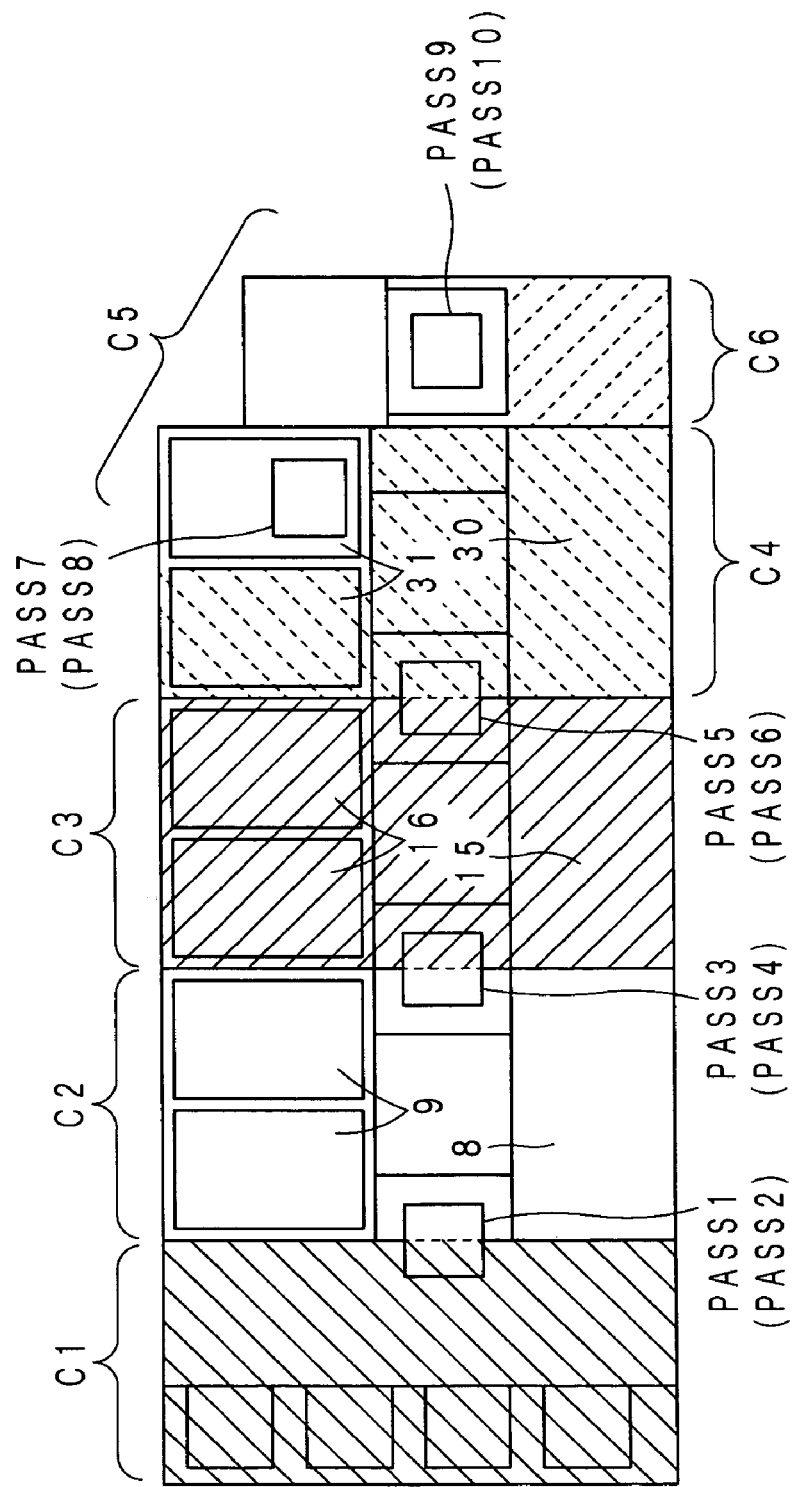
FIG. 7 is a plan view showing a cell arrangement in the substrate processing apparatus according to the present invention.
Figure 8:
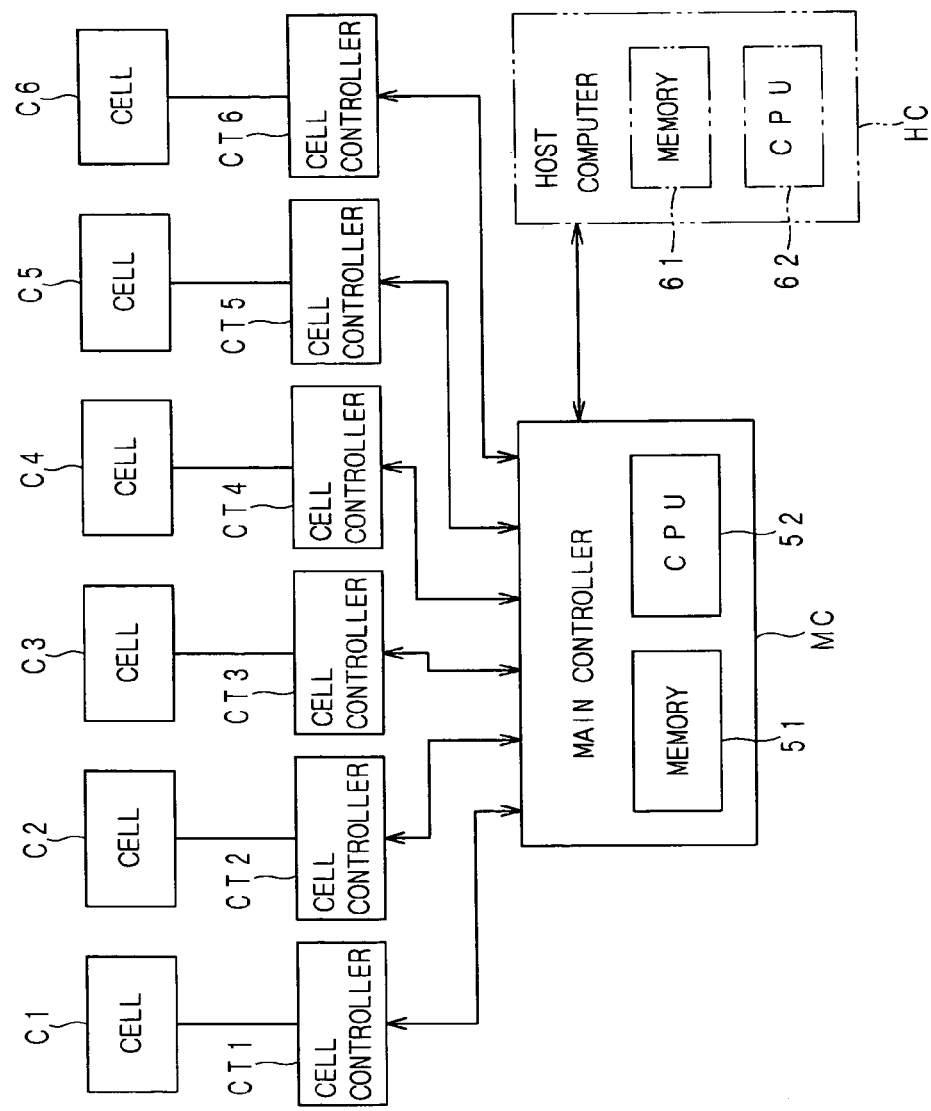
FIG. 8 is a schematic block diagram showing the construction of a control system in the substrate processing apparatus according to the present invention.

FIG. 6 is a plan view showing the arrangement of the blocks 1 to 5 in the substrate processing apparatus 100. FIG. 7 is a plan view showing a cell arrangement in the substrate processing apparatus 100. FIG. 8 is a block diagram showing a control system in the substrate processing apparatus 100. The control system in the substrate processing apparatus 100 will be described according to the first preferred embodiment.

As described above, the substrate processing apparatus 100 is divided into the indexer block 1, the anti-reflection film processing block 2, the resist film processing block 3, the development processing block 4, and the interface block 5 (FIG. 6). Conventionally, when a substrate processing apparatus employs a hardware construction divided into blocks in this manner, the blocks have respective controllers which control the status of processes in the corresponding blocks (e.g., the status of the heating process of substrates W by the heating plates HP in the blocks, and the transport status of substrates W). According to the first preferred embodiment, on the other hand, the entire substrate processing apparatus 100 is divided into a plurality of components referred to as cells, and controllers corresponding to the respective cells control the processing status in the respective cells, the transport status of substrates W, and the like.

The cells refer to the components into which the substrate processing apparatus 100 is divided on the basis of the indexer-specific transport mechanism 7, the main transport mechanisms 10A to 10D and the interface-specific transport mechanism 35 (which are also referred to as "substrate transport mechanisms"). In other words, the substrate processing apparatus 100 is divided into cells C1 to C6 on the basis of areas in which the respective substrate transport mechanisms transfer substrates W, as shown in FIG. 7.

The indexer cell C1 is a component for receiving unprocessed substrates W from the outside of the substrate processing apparatus 100 and for transferring processed substrates W to the outside, and corresponds to the indexer block 1. In other words, the indexer cell C1 is a division of the substrate processing apparatus 100 on the basis of the indexer-specific transport mechanism 7, and principally comprises the indexer-specific transport mechanism 7 and a cell controller CT1 (See FIG. 8) serving as a controller for the indexer cell C1.

The anti-reflection film processing cell C2 is a component for forming the anti-reflection film, and corresponds to the anti-reflection film processing block 2. In other words, the anti-reflection film processing cell C2 is a division of the substrate processing apparatus 100 on the basis of the first main transport mechanism 10A, and principally comprises the first main transport mechanism 10A, the first coating processor 8, the first thermal processor 9, and a cell controller CT2 (See FIG. 8). In accordance with the processing status and transport status of substrates W in the anti-reflection film processing cell C2, the cell controller CT2 controls the states of hardware components in the anti-reflection film processing cell C2.

The resist film processing cell C3 is a component for forming the photoresist film on substrates W, and corresponds to the resist film processing block 3. In other words, the resist film processing cell C3 is a division of the substrate processing apparatus 100 on the basis of the second main transport mechanism 10B, and principally comprises the second main transport mechanism 10B, the second coating processor 15, the second thermal processor 16, and a cell controller CT3 (See FIG. 8). In accordance with the processing status and transport status of substrates W in the resist film processing cell C3, the cell controller CT3 controls the states of hardware components in the resist film processing cell C3.

The development processing cell C4 is a component for performing the development process on substrates W subjected to the exposure process, and corresponds to some hardware components included in the development processing block 4. In other words, the development processing cell C4 is a division of the substrate processing apparatus 100 on the basis of the third main transport mechanism 10C, and principally comprises the third main transport mechanism 10C, the development processor 30, the heating plates HP and cooling units CP of the third thermal processor 31 which are disposed on the resist film processing block 3 side, and a cell controller CT4 (See FIG. 8). In accordance with the processing status and transport status of substrates W in the development processing cell C4, the cell controller CT4 controls the states of hardware components in the development processing cell C4.

The post-exposure heating processing cell C5 is a component for performing the post-exposure heating process on substrates W subjected to the exposure process, and corresponds to some hardware components of the development processing block 4 and some hardware components of the interface block 5. In other words, the post-exposure heating processing cell C5 is a division of the substrate processing apparatus 100 on the basis of the fourth main transport mechanism 10D, and principally comprises the fourth main transport mechanism 10D, the heating parts PHP and cooling unit CP of the third thermal processor 31 which are disposed on the interface block 5 side, the return buffer RBF, and a cell controller CT5 (See FIG. 8). In accordance with the processing status and transport status of substrates W in the post-exposure heating processing cell C5, the cell controller CT5 controls the states of hardware components in the post-exposure heating processing cell C5.

The interface cell C6 is a component for transferring substrates W between the substrate processing apparatus 100 and the exposure apparatus STP serving as an external apparatus, and corresponds to some components of the interface block 5. In other words, the interface cell C6 is a division of the substrate processing apparatus 100 on the basis of the interface-specific transport mechanism 35, and principally comprises the interface-specific transport mechanism 35, the edge exposure units EEW, the feed buffer SBF, and a cell controller CT6 (See FIG. 8). In accordance with the processing status and transport status of substrates W in the interface cell C6, the cell controller CT6 controls the states of hardware components in the interface cell C6.

Thus, the cells C1 to C6 are independently controllable by the corresponding cell controllers CT1 to CT6, respectively. The cell controllers CT1 to CT6 are connected to a main controller MC, as shown in FIG. 8.

The main controller MC is a control device for controlling the operational status of the hardware components included in the cells C1 to C6 of the substrate processing apparatus 100 to manage the semiconductor manufacturing process steps of the substrate processing apparatus 100. The main controller MC comprises a memory 51 for storing a program, variables and the like, and a CPU 52 for effecting control in accordance with the program stored in the memory 51. The main controller MC is connected for communication with the cell controllers CT1 to CT6 through a wired or wireless network.

Thus, the main controller MC can receive operational status data indicative of the operational status of the hardware components (e.g., the temperature of the heating plates HP, and the transport status of the substrate transport mechanisms) from the cell controllers CT1 to CT6 for the corresponding cells C1 to C6. Based on the operational status data, the main controller MC executes a computational process for obtaining the operational status of the hardware components for optimum substrate processing, and transmits control signals for placing the operational status of the hardware components into a predetermined state (e.g., a predetermined temperature of the heating plates HP included in the anti-reflection film processing cell C2) to a selected one of the cell controllers CT1 to CT6, thereby optimizing the operational status of the hardware components included in the cells C1 to C6.

The main controller MC is also connected for communication with a host computer HC for managing the entire semiconductor manufacturing process steps of a plurality of substrate processing apparatuses including the substrate processing apparatus 100 through a wired or wireless network. The host computer HC is a control device comprising a memory 61 for storing a program, variables and the like, and a CPU 62 for effecting control in accordance with the program stored in the memory 61. Transmitting data about the status of semiconductor substrates being manufactured by the respective substrate processing apparatuses from the main controller MC through the network to the host computer HC enables the host computer HC to easily grasp the manufacturing status of the semiconductor substrates.

<1.3. Operation of Substrate Processing Apparatus>

Operations of the respective cells, i.e. the indexer cell C1, the anti-reflection film processing cell C2, the resist film processing cell C3, the development processing cell C4, the post-exposure heating processing cell C5 and the interface cell C6, of the substrate processing apparatus 100 will be described.

The operation of the indexer cell C1 will be described first. In the indexer cell C1, the indexer-specific transport mechanism 7 takes out an unprocessed substrate W from a cassette C, and moves horizontally to the position opposed to the substrate rest parts PASS1 and PASS2 to place the unprocessed substrate W onto the substrate rest part PASS1. When the cell controller CT1 detects that a processed substrate W is placed on the substrate rest part PASS2, the indexer-specific transport mechanism 7 is moved horizontally to the position opposed to the substrate rest parts PASS1 and PASS2 to receive the substrate W from the substrate rest part PASS2.

The operation of the anti-reflection film processing cell C2 will be described next. In the anti-reflection film processing cell C2, when the cell controller CT2 detects that an unprocessed substrate W is placed on the substrate rest part PASS1, the first main transport mechanism 10A is moved horizontally to a position opposed to the substrate rest parts PASS1 and PASS2 to receive the substrate W from the substrate rest part PASS1. Next, the substrate W is transported into the first coating processor 8 which in turn performs the process of coating the substrate W with the anti-reflection film. The substrate W coated with the anti-reflection film is transported into the first thermal processor 9 which in turn performs a predetermined thermal process on the substrate W. The first main transport mechanism 10A horizontally transports the substrate W subjected to the coating process and the thermal process to a position opposed to the substrate rest parts PASS3 and PASS4 to place the substrate W onto the upper substrate rest part PASS3.

In the anti-reflection film processing cell C2, when the cell controller CT2 detects that a substrate W subjected to the exposure process is placed on the substrate rest part PASS4, the first main transport mechanism 10A is moved horizontally to the position opposed to the substrate rest parts PASS3 and PASS4 to receive the substrate W from the lower substrate rest part PASS4. Then, the first main transport mechanism 10A moves to the position opposed to the substrate rest parts PASS1 and PASS2 to place the substrate W subjected to the exposure process onto the lower substrate rest part PASS2.

The operation of the resist film processing cell C3 will be described next. In the resist film processing cell C3, when the cell controller CT3 detects that a substrate W coated with the anti-reflection film is placed on the substrate rest part PASS3, the second main transport mechanism 10B is moved horizontally to a position opposed to the substrate rest parts PASS3 and PASS4 to receive the substrate W from the upper substrate rest part PASS3. Next, the substrate W coated with the anti-reflection film is transported into the second coating processor 15 which in turn performs the process of coating the substrate W with the resist film. The substrate W coated with the resist film is transported into the second thermal processor 16 which in turn performs a predetermined thermal process on the substrate W. The second main transport mechanism 10B horizontally transports the substrate W subjected to the coating process and the thermal process to a position opposed to the substrate rest parts PASS5 and PASS6 to place the substrate W onto the upper substrate rest part PASS5.

In the resist film processing cell C3, when the cell controller CT3 detects that a substrate W subjected to the exposure process is placed on the substrate rest part PASS6, the second main transport mechanism 10B is moved horizontally to the position opposed to the substrate rest parts PASS5 and PASS6 to receive the substrate W from the lower substrate rest part PASS6. Then, the second main transport mechanism 10B moves to the position opposed to the substrate rest parts PASS3 and PASS4 to place the substrate W subjected to the exposure process onto the lower substrate rest part PASS4.

The operation of the development processing cell C4 will be described next. In the development processing cell C4, when the cell controller CT4 detects that a substrate W is placed on the substrate rest part PASS5, the third main transport mechanism 10C is moved to a position opposed to the substrate rest parts PASS5 and PASS6 to receive the substrate W coated with the resist film, and moves horizontally to a position opposed to the substrate rest parts PASS7 and PASS8 to transfer the substrate W coated with the resist film to the substrate rest part PASS7.

In the development processing cell C4, when the cell controller CT4 detects that an exposed substrate W is placed on the substrate rest part PASS8, the third main transport mechanism 10C is moved to the position opposed to the substrate rest parts PASS7 and PASS8 to receive the substrate W from the substrate rest part PASS8. Next, the exposed substrate W is transported into the development processor 30 which in turn performs the development process on the substrate W. The substrate W subjected to the development process is transported into the third thermal processor 31 which in turn performs a predetermined thermal process on the substrate W. The third main transport mechanism 10C horizontally transports the substrate W subjected to the development process and the thermal process to the position opposed to the substrate rest parts PASS5 and PASS6 to place the substrate W onto the lower substrate rest part PASS6.

The operation of the post-exposure heating processing cell C5 will be described next. In the post-exposure heating processing cell C5, when the cell controller CT5 detects that a substrate W is placed on the substrate rest part PASS7, the fourth main transport mechanism 10D is moved vertically to a position opposed to the substrate rest parts PASS7 and PASS8 to receive the substrate W coated with the resist film from the upper substrate rest part PASS7. The substrate W is transported into one of the edge exposure units EEW which in turn performs the edge exposure process on the substrate W. The fourth main transport mechanism 10D vertically transports the substrate W subjected to the edge exposure process from the one edge exposure unit EEW to a position opposed to the substrate rest parts PASS9 and PASS10 to place the substrate W onto the upper substrate rest part PASS9.

When the cell controller CT5 detects that a substrate W is placed on the substrate rest part PASS10, the fourth main transport mechanism 10D is moved vertically to the position opposed to the substrate rest parts PASS9 and PASS10 to receive the exposed substrate W from the lower substrate rest part PASS10. Next, the exposed substrate W is transported into one of the heating parts PHP included in the third thermal processor 31 of the post-exposure heating processing cell C5, which in turn performs the post-exposure heating process on the substrate W. The fourth main transport mechanism 10D vertically transports the substrate W subjected to the post-exposure heating process to the position opposed to the substrate rest parts PASS7 and PASS8 to place the substrate W subjected to the post-exposure heating process onto the lower substrate rest part PASS8. The operation of the post-exposure heating process in the post-exposure heating processing cell C5 will be described in detail later.

The operation of the interface cell C6 will be described next. In the interface cell C6, when the cell controller CT6 detects that a substrate W coated with the resist film is placed on the substrate rest part PASS9, the interface-specific transport mechanism 35 is moved to a position opposed to the substrate rest parts PASS9 and PASS10 to receive the substrate W from the upper substrate rest part PASS9. Then, the interface-specific transport mechanism 35 transfers and receives substrates W to and from a transport mechanism (not shown) of the exposure apparatus STP.

When receiving a substrate W subjected to the exposure process from the transport mechanism (not shown) of the exposure apparatus STP, the interface-specific transport mechanism 35 moves to the position opposed to the substrate rest parts PASS9 and PASS10 to place the substrate W onto the lower substrate rest part PASS10.

Through the above-mentioned operations of the respective cells C1 to C6, a substrate W transported into the indexer cell C1 of the substrate processing apparatus 100 is subjected to the anti-reflection film coating process in the anti-reflection film processing cell C2, the resist film coating process in the resist film processing cell C3, the edge exposure process in the interface cell C6, the post-exposure heating process in the post-exposure heating processing cell C5 and the development process in the development processing cell C4 in the order named while being transported to the substrate rest parts PASS1, PASS3, PASS5, PASS7, PASS9, PASS10, PASS8, PASS6, PASS4 and PASS2 in the order named.

<1.4. Operation in Post-Exposure Heating Processing Cell>

In the substrate processing apparatus 100 according to the first preferred embodiment, the resist film is formed by applying the chemically amplified resist onto substrates W, as described above. When the exposure process is performed on the resist film employing the chemically amplified resist, an acid catalyst is created in portions of the resist film exposed to light by the exposure process, whereby patterns having a three-dimensional distribution which are to become interconnect patterns are latent in the resist film. Next, when the heating parts PHP heat the resist film subjected to the exposure process together with the substrates W, a chemical reaction which will cause a change in the rate of dissolution in the developing solution is activated by the catalytic action of the acid catalyst created in the exposed portions, to form desired interconnect patterns in the resist film. The chemical reaction is substantially stopped by the cooling action of the holding plate 24 when the local transport mechanism 20 transports each of the substrates W subjected to the heating process by the heating plates HP.

After the cooling process by the holding plate 24, the interconnect patterns in the resist film are little influenced by the acid catalyst, and therefore can be stable in the resist film. For this reason, the line widths of the interconnect patterns in the resist film are held substantially the same if there are variations in the length of the time interval between the completion of the process in the post-exposure heating processing cell C5 and the start of the development process in the development processing cell C4.

However, the chemical reaction due to the acid catalyst created in the resist film also proceeds during the time interval between the completion of the exposure process and the start of the heating process, that is, the time interval between the instant at which the exposure process is completed in the exposure apparatus STP and the instant at which the substrates W are transported to the heating parts PHP in the third thermal processor 31 through the transport mechanism (not shown) of the exposure apparatus STP, the interface-specific transport mechanism 35 and the fourth main transport mechanism 10D.

The variations in the length of the time interval (also referred to hereinafter as "post-exposure delay time") required between the completion of the exposure process and the start of the heating process give rise to variations in the amount of acid catalyst created in the resist film. As a result, there arise variations in the progress of the chemical reaction caused by the catalytic action of the acid catalyst, that is, the chemical reaction which will cause a change in the rate of dissolution in the developing solution. This produces variations in dimensional accuracy of the line widths and the like of the patterns formed in the resist films by the development process, thereby to affect the dimensional accuracy of interconnect patterns formed on the substrates W.

The first preferred embodiment solves the above-mentioned problem by controlling the operational status of the third thermal processor 31 and the fourth main transport mechanism 10D so that a plurality of substrates W are substantially the same in the length of post-exposure delay time in the post-exposure heating process. The details of the operation of the post-exposure heating processing cell C5 will be described.

FIG. 9 is a block diagram showing control signals for the exposure apparatus STP, the post-exposure heating processing cell C5 and the main controller MC. When movement parameters (e.g., acceleration time and deceleration time of a motor (not shown) included in the screw feed drive mechanism 25 of the local transport mechanism 20) used for vertical movement of the local transport mechanism 20 (See FIGS. 4A and 4B) in the heating part PHP are constant, a plurality of substrates W are made substantially the same in the length of the time interval T11 between the start of the transport of each substrate W temporarily placed on the temporary substrate rest part 19 of the heating part PHP by the local transport mechanism 20 and the start of the heating process of each substrate W by the holding plate 24. In the operation of the post-exposure heating processing cell C5 according to the first preferred embodiment, description is given on a technique for controlling the start timing of heating of the substrates W by providing substantially the same length of the time interval between the completion of the exposure process in the exposure apparatus STP and the start of the transport by the local transport mechanism 20.

After the exposure process for exposure in predetermined interconnect patterns in an exposure part EXP (See FIG. 9) included in the exposure apparatus STP, the exposure part EXP transmits an exposure completion signal 71 indicating that the exposure process is completed to a controller CTR for controlling the operational status of hardware components (e.g., the exposure part EXP) included in the exposure apparatus STP. The exposure completion signal 71 is transmitted through the controller CTR to the main controller MC. Then, an exposure completion time t11 is stored in the memory 51 of the main controller MC.

The exposure completion time t11 stored in the memory 51 may be the time when the exposure is completed which is measured by the exposure part EXP and transmitted from the exposure part EXP through the controller CTR to the main controller MC. Alternatively, the exposure completion time t11 stored in the memory 51 may be the time when the exposure completion signal 71 is received by the main controller MC.

The exposed substrate W is placed on the substrate rest part PASS10 by the interface-specific transport mechanism 35 of the interface cell C6.

Subsequently, when the cell controller CT5 detects that the exposed substrate W is placed on the substrate rest part PASS10, the cell controller CT5 causes the fourth main transport mechanism 10D to move vertically to the position opposed to the substrate rest parts PASS9 and PASS10 and to receive the substrate W from the substrate rest part PASS10. Next, the cell controller CT5 causes the fourth main transport mechanism 10D to move vertically to a position opposed to one of the heating parts PHP of the third thermal processor 31 which is specified by the cell controller CT5, and causes the fixed support pins 23 of the temporary substrate rest part 19 of the specified heating part PHP to support the substrate W.

When a sensor not shown or the like detects that the substrate W is supported by the temporary substrate rest part 19, a substrate support completion signal 72 indicating that the substrate W is supported by the temporary substrate rest part 19 is transmitted from the heating part PHP to the cell controller CT5. The substrate support completion signal 72 is transmitted through the cell controller CT5 to the main controller MC.

The main controller MC which has recognized from the receipt of the substrate support completion signal 72 that the substrate W is supported by the temporary substrate rest part 19 of the heating part PHP transmits a substrate transport signal 73 to the cell controller CT5 at time t12 which is a predetermined time interval T12 later than the exposure completion time t11. The substrate transport signal 73 is transmitted through the cell controller CT5 to the heating part PHP.

The substrate transport signal 73 is a control signal used to trigger the process of transporting the substrate W supported by the temporary substrate rest part 19 of the heating part PHP to the heating plate HP of the heating part PHP by the local transport mechanism 20 to start the heating process of the substrate W by the heating plate HP. Specifically, when the heating part PHP receives the substrate transport signal 73, the substrate W supported by the temporary substrate rest part 19 is transported from the temporary substrate rest part 19 to over the heating plate HP by the local transport mechanism 20, and is supported by the movable support pins 21 of the heating plate HP. Then, the heating process of the substrate W starts at time t13 at which the lower surface of the substrate W is brought into contact with the upper surface of the heating plate HP by the downward movement of the movable support pins 21.

When the heating part PHP receives the substrate transport signal 73, the substrate W is taken from the temporary substrate rest part 19 by the local transport mechanism 20 and is transported to the heating plate HP. Thus, the substrate transport signal 73 is used to adjust the length of time that the substrate W rests on the temporary substrate rest part 19.

The predetermined time interval T12 is obtained by subtracting the time interval T11 between the start of the transport of the substrate W supported by the temporary substrate rest part 19 and the start of the heating process of the substrate W by the heating plate HP from the time interval T1 between the completion of the exposure process and the start of the heating process by the heating part PHP, that is, T12=T1−T11. The time interval T1 is determined by the type of the resist film, the method of heating in the heating part PHP and the like, and is previously obtained by experiment or the like. The time interval T11 is also previously obtained by actually operating the local transport mechanism 20.

After the heating process by the heating plate HP, the movable support pins 21 move upwardly. Subsequently, the holding plate 24 is moved through the opening 19c into space between the lower surface of the substrate W and the upper surface of the heating plate HP, and is moved upwardly to receive the substrate W. Then, the holding plate 24 is moved out of the enclosure 27, and is moved upwardly to cause the temporary substrate rest part 19 to support the substrate W. In this process, the substrate W is cooled by the holding plate 24.

The fourth main transport mechanism 10D receives the substrate W supported by the temporary substrate rest part 19, and is moved vertically to the position opposed to the substrate rest parts PASS7 and PASS8 to place the substrate W subjected to the post-exposure heating process onto the lower substrate rest part PASS8. This completes the process of the substrate W in the post-exposure heating processing cell C5.

If the development processing cell C4 cannot perform the development process because of a malfunction of the third main transport mechanism 10C of the development processing cell C4 or the like, the substrate W is temporarily stored in the return buffer RBF of the post-exposure heating processing cell C5 because the substrate W cannot be fed to the development processing cell C4.

In this case, the substrate W subjected to the thermal process in the heating part PHP of the post-exposure heating processing cell C5 is stored in the return buffer RBF in the post-exposure heating processing cell C5 according to the first preferred embodiment. This prevents the variations in the line widths of the interconnect patterns formed in the resist film if the development processing cell C4 is placed into a developable condition and the substrate W stored in the return buffer RBF is fed into the development processing cell C4 and subjected to the development process. Thus, the substrate processing apparatus 100 according to the first preferred embodiment is capable of making the line widths of the interconnect patterns of the resist film substantially the same even if a situation occurs in which it is impossible to immediately perform the development process on the substrate W subjected to the exposure process.

<1.5. Advantages of Substrate Processing Apparatus According to First>Preferred Embodiment As described above, the post-exposure heating processing cell C5 according to the first preferred embodiment makes the vertical movement parameters of the local transport mechanism 20 constant, thereby to make constant the time interval T11 between the start of the transport of each substrate W placed on the temporary substrate rest part 19 of the heating part PHP and the start of the heating process by the heating plate HP of the heating part PHP. Additionally, the post-exposure heating processing cell C5 according to the first preferred embodiment adjusts the length of the time interval during which each substrate W rests on the temporary substrate rest part 19 by the use of the substrate transport signal 73, thereby to make constant the time interval T12 between the completion of the exposure process and the start of the transport of each substrate W from the temporary substrate rest part 19 of the heating part PHP to the heating plate HP thereof. Thus, if there are variations in the time at which each substrate W is placed on the temporary substrate rest part 19, the post-exposure heating processing cell C5 adjusts the time at which the transport of each substrate W from the temporary substrate rest part 19 starts, to provide substantially the same length of the time interval between the completion of the exposure process and the start of the heating process of each substrate W, and substantially the same length of the time interval between the completion of the exposure process and the start of the cooling process of each substrate W which is subsequent to the above-mentioned heating process. This makes the line widths of the interconnect patterns of the resist film substantially the same.

Further, the post-exposure heating processing cell C5 according to the first preferred embodiment can perform the heating process and its subsequent cooling process on substrates W at the time which is the constant predetermined time interval T1 later than the completion of the exposure process. Thus, the chemical reaction due to the acid catalyst created in the resist film is stopped in the same manner for each substrate. This holds the interconnect patterns of the resist film for the respective substrates W substantially the same even if a substrate W is temporarily stored in the return buffer RBF because it is impossible to feed the substrate W from the post-exposure heating processing cell C5 to the development processing cell C4.

Moreover, as shown in FIGS. 4A and 4B, the temporary substrate rest chamber in which the temporary substrate rest part 19 of the heating part PHP is disposed and the heating chamber in which the heating plate HP is disposed are in vertically stacked relationship, and the temporary substrate rest part 19 and the heating plate HP are vertically isolated from each other. The transfer of substrates W between the temporary substrate rest part 19 and the heating plate HP is carried out only by the local transport mechanism 20.

This prevents each substrate W placed on the temporary substrate rest part 19 from being influenced by heat from the heating plate HP. Specifically, heat is emitted from the heating plate HP when the heating plate HP operates. However, the temporary substrate rest part 19 is isolated from the heating plate HP, and each substrate W subjected to the heating process is cooled by the holding plate 24 of the local transport mechanism 20.

For the two reasons, each substrate W is not supplied with heat emitted or transferred from the heating plate HP during the time interval between the completion of the exposure process and the start of the heating process in the heating part PHP. This prevents the variations in the amount of acid catalyst created in the resist film in the heating part PHP, thereby to make the line widths of the interconnect patterns formed in the resist film substantially the same.

2. Second Preferred Embodiment

Next, a second preferred embodiment according to the present invention will be described. The second preferred embodiment is similar to the first preferred embodiment in having a hardware construction similar to that of the substrate processing apparatus 100 of the first preferred embodiment, but is different from the first preferred embodiment in the operation in the post-exposure heating processing cell C5. Thus, the operation in the post-exposure heating processing cell C5 will be described below.

<2.1. Operation in Post-Exposure Heating Processing Cell>

Figure 10:
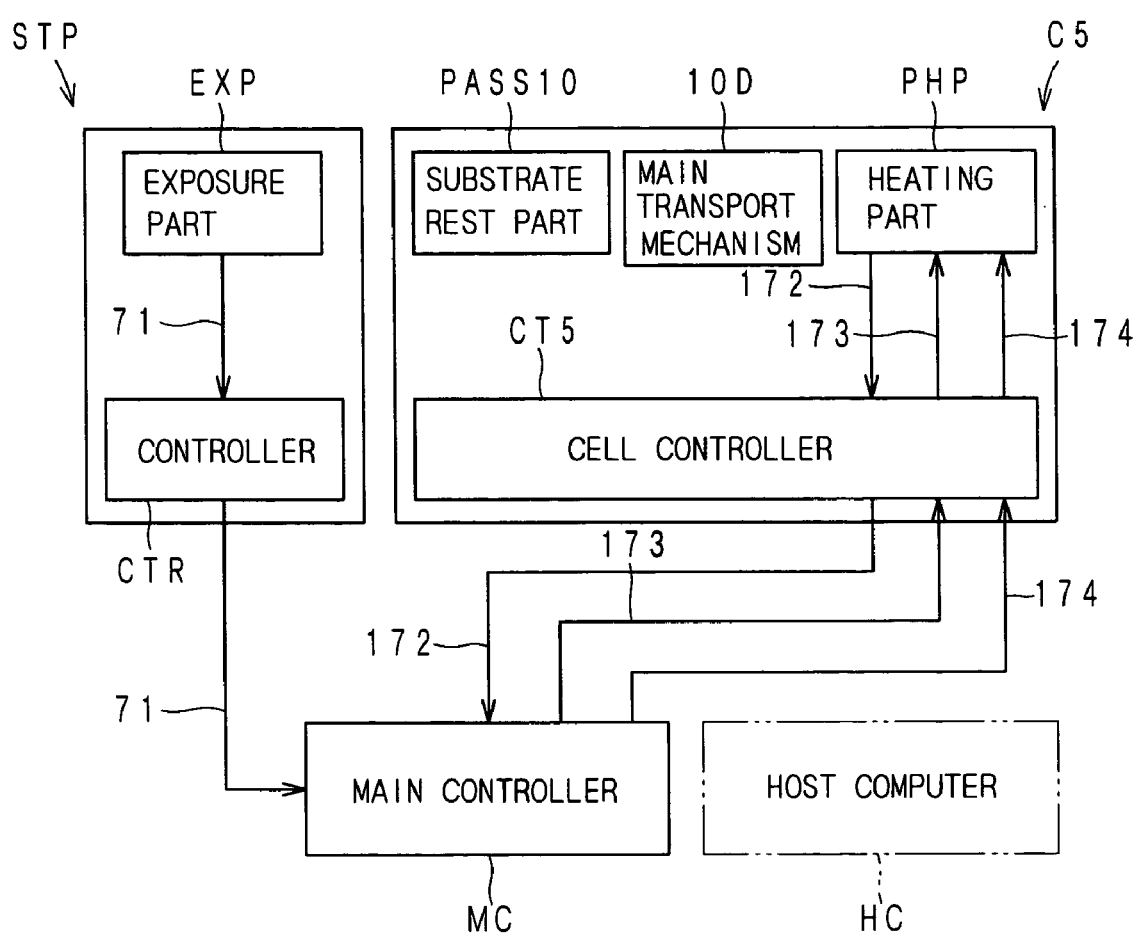
FIG. 10 is a block diagram showing control signals for the exposure apparatus, the post-exposure heating processing cell, and the main controller according to a second preferred embodiment of the present invention.

FIG. 10 is a block diagram showing control signals for the exposure apparatus STP, the post-exposure heating processing cell C5 and the main controller MC according to the second preferred embodiment. The second preferred embodiment adjusts the movement parameters used for vertical movement of the local transport mechanism 20 to provide substantially the same length of the time interval between the completion of the exposure process and the start of the heating process, thereby controlling the start timing of the heating of substrates W. The operation in the post-exposure heating processing cell C5 according to the second preferred embodiment will be described below.

After the exposure process of a substrate W in the exposure part EXP included in the exposure apparatus STP, the exposure part EXP transmits the exposure completion signal 71 indicating that the exposure process is completed to the controller CTR. The exposure completion signal 71 is transmitted through the controller CTR to the main controller MC. Then, an exposure completion time t21 is stored in the memory 51 of the main controller MC.

Like the exposure completion time t11 of the first preferred embodiment, the exposure completion time t21 may be time data indicating the time when the exposure is completed which is measured by the exposure part EXP and transmitted with the exposure completion signal 71 from the exposure part EXP. Alternatively, the exposure completion time t21 may be the time when the exposure completion signal 71 is received by the main controller MC.

Next, when the cell controller CT5 detects that the exposed substrate W is placed on the substrate rest part PASS10, the fourth main transport mechanism 10D receives the substrate W from the substrate rest part PASS10, and transports the exposed substrate W to the temporary substrate rest part 19 of one of the heating parts PHP of the third thermal processor 31 which is specified by the cell controller CT5.

Subsequently, when a sensor not shown or the like detects that the substrate W is supported by the temporary substrate rest part 19, a substrate support completion signal 172 indicating that the substrate W is supported by the temporary substrate rest part 19 is transmitted from the heating part PHP to the cell controller CT5.

The substrate support completion signal 172 is transmitted through the cell controller CT5 to the main controller MC. The main controller MC stores a substrate support completion time t22 at which the substrate W is supported by the temporary substrate rest part 19 of the specified heating part PHP. Like the exposure completion time t21, the substrate support completion time t22 may be time data indicating the time when the substrate W is supported by the temporary substrate rest part 19 which is transmitted with the substrate support completion signal 172. Alternatively, the substrate support completion time t22 may be the time when the substrate support completion signal 172 is received by the main controller MC.

The main controller MC which has received the substrate support completion signal 172 computes the movement parameters used for vertical movement of the local transport mechanism 20 to be described later by means of the CPU 52 to transmit the computed movement parameters as a movement setting signal 173 to the cell controller CT5 of the post-exposure heating processing cell C5.

A movement time interval T23 required to move the substrate W held by the holding plate 24 from the position opposed to the temporary substrate rest part 19 to the position opposed to the heating plate HP is expressed by $$T23 = T1 - ((t22 - t21) + T21 + T22) \quad (1)$$

where T1 is the time interval between the completion of the exposure process and the start of the heating process in the heating part PHP; T21 is a time interval required for the holding plate 24 of the local transport mechanism 20 to receive the substrate W supported by the temporary substrate rest part 19; T22 is a time interval required to transfer the substrate W held by the holding plate 24 of the local transport mechanism 20 to the movable support pins 21 of the heating plate HP to start the heating process by the heating plate HP; t21 is the above-mentioned exposure completion time; and t22 is the above-mentioned substrate support completion time. As in the first preferred embodiment, the time interval T1 is determined by the type of the resist film, the method of heating in the heating part PHP and the like, and is previously obtained by experiment or the like. The time intervals T21 and T22 are also previously obtained by actually operating the local transport mechanism 20.

Therefore, when the time intervals T1, T21 and T22 are constant, the main controller MC having received the substrate support completion signal 172 sets the vertical movement parameters (e.g., acceleration time and deceleration time of a motor (not shown) included in the screw feed drive mechanism 25 of the local transport mechanism 20) of the local transport mechanism 20 so that the vertical movement time of the local transport mechanism 20 is equal to T23, to provide a constant time interval between the exposure completion time t21 and the start of the heating by the heating plate HP of the heating part PHP. The main controller MC also transmits a substrate transport instruction signal 174 giving an instruction to start the movement of the local transport mechanism 20 to the cell controller CT5 simultaneously with the transmission of the movement setting signal 173.

Upon receipt of the movement setting signal 173 and the substrate transport instruction signal 174, the cell controller CT5 sets the vertical movement parameters of the local transport mechanism 20, based on the movement setting signal 173. The transmission of the substrate transport instruction signal 174 from the cell controller CT5 to the local transport mechanism 20 causes the movement of the substrate W from the temporary substrate rest part 19 to the heating plate HP and the start of the thermal process of the exposed substrate W.

After the heating process by the heating plate HP, the movable support pins 21 move upwardly. Subsequently, the holding plate 24 is moved through the opening 19c into the space between the lower surface of the substrate W and the upper surface of the heating plate HP, and is moved upwardly to receive the substrate W. Then, the holding plate 24 is moved out of the enclosure 27, and is moved upwardly to cause the temporary substrate rest part 19 to support the substrate W. In this process, the substrate W is cooled by the holding plate 24.

The fourth main transport mechanism 10D receives the substrate W supported by the temporary substrate rest part 19, and is moved vertically to the position opposed to the substrate rest parts PASS7 and PASS8 to place the substrate W subjected to the post-exposure heating process onto the lower substrate rest part PASS8. This completes the process of the substrate W in the post-exposure heating processing cell C5.

If the development processing cell C4 cannot perform the development process, the substrate W subjected to the thermal process in the heating part PHP is temporarily stored in the return buffer RBF of the post-exposure heating processing cell C5, as in the first preferred embodiment.

<2.2. Advantages of Substrate Processing Apparatus According to Second Preferred Embodiment>

As described above, the post-exposure heating processing cell C5 according to the second preferred embodiment adjusts the vertical movement parameters of the local transport mechanism 20 to adjust the movement time interval T23, i.e. the transport time interval during which each substrate W is transported. Thus, if there are variations in the time at which each substrate W is placed on the temporary substrate rest part 19, the post-exposure heating processing cell C5 can provide substantially the same length of the time interval between the completion of the exposure process and the start of the heating process of each substrate W, and substantially the same length of the time interval between the completion of the exposure process and the start of the cooling process of each substrate W which is subsequent to the above-mentioned heating process. This makes the line widths of the interconnect patterns formed in the resist film substantially the same.

Further, the post-exposure heating processing cell C5 according to the second preferred embodiment can perform the heating process and its subsequent cooling process on substrates W at the time which is the constant predetermined time interval T1 later than the completion of the exposure process. Thus, the chemical reaction due to the acid catalyst created in the resist film is stopped in the same manner for each substrate. This holds the interconnect patterns of the resist film for the respective substrates W substantially the same, as in the first preferred embodiment, even if a substrate W is temporarily stored in the return buffer RBF because it is impossible to feed the substrate W from the post-exposure heating processing cell C5 to the development processing cell C4.

Moreover, as shown in FIGS. 4A and 4B, the temporary substrate rest chamber in which the temporary substrate rest part 19 of the heating part PHP is disposed and the heating chamber in which the heating plate HP is disposed are in vertically stacked relationship, and the temporary substrate rest part 19 and the heating plate HP are vertically isolated from each other. The transfer of substrates W between the temporary substrate rest part 19 and the heating plate HP is carried out only by the local transport mechanism 20. This prevents each substrate W from being influenced by heat from the heating plate HP, as in the first preferred embodiment, thereby to make the line widths of the interconnect patterns formed in the resist film substantially the same.

3. Third Preferred Embodiment

Next, a third preferred embodiment according to the present invention will be described. The third preferred embodiment is similar to the first preferred embodiment in having a hardware construction similar to that of the substrate processing apparatus 100 of the first preferred embodiment, but is different from the first preferred embodiment in the operation in the post-exposure heating processing cell C5, as in the second preferred embodiment. Thus, the operation in the post-exposure heating processing cell C5 will be described below.

<3.1. Operation in Post-Exposure Heating Processing Cell>

Figure 11:
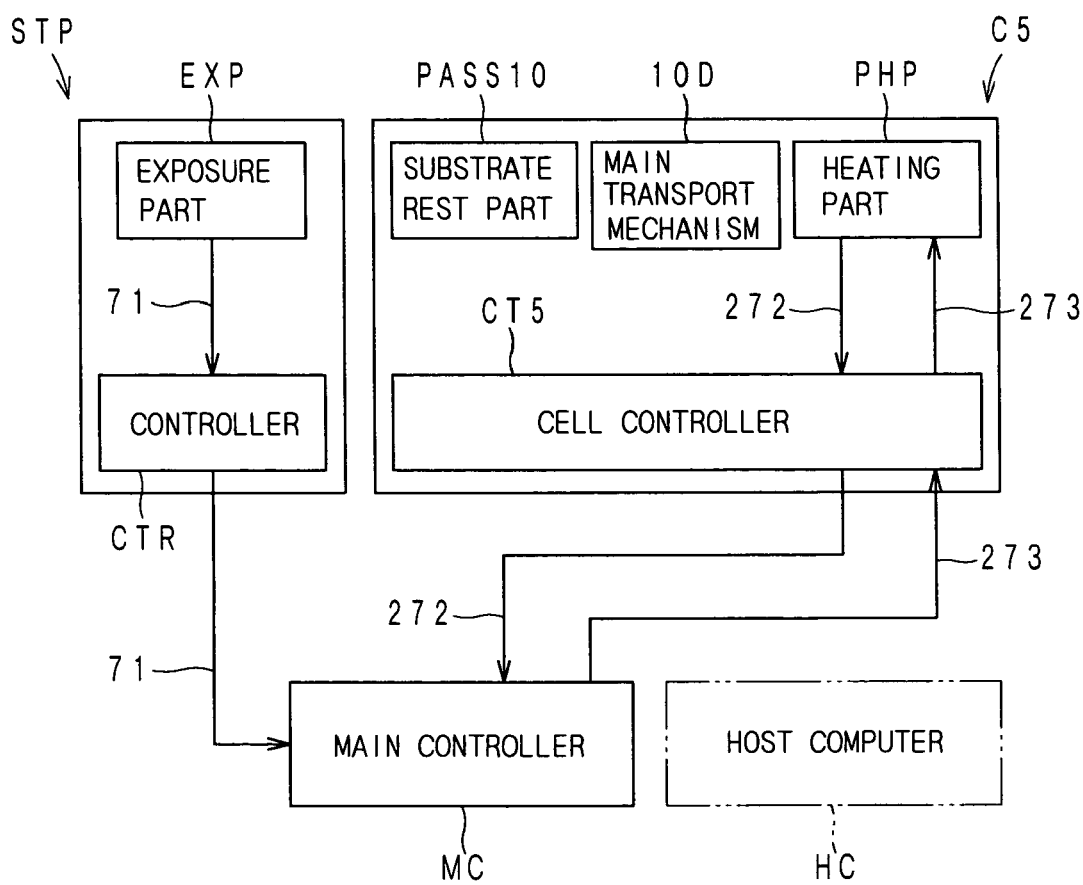
FIG. 11 is a block diagram showing control signals for the exposure apparatus, the post-exposure heating processing cell, and the main controller according to a third preferred embodiment of the present invention.

FIG. 11 is a block diagram showing control signals for the exposure apparatus STP, the post-exposure heating processing cell C5 and the main controller MC according to the third preferred embodiment. The third preferred embodiment adjusts the timing of the retraction of the movable support pins 21 into the upper surface of the heating plate HP for substrates W transported to the heating plate HP of the heating part PHP, to provide substantially the same length of the time interval between the completion of the exposure process and the start of the heating process, thereby controlling the start timing of the heating of the substrates W. The operation in the post-exposure heating processing cell C5 according to the third preferred embodiment will be described below.

After the exposure process of a substrate W in the exposure part EXP included in the exposure apparatus STP, the exposure part EXP transmits the exposure completion signal 71 indicating that the exposure process is completed to the controller CTR. The exposure completion signal 71 is transmitted through the controller CTR to the main controller MC. Then, an exposure completion time t31 is stored in the memory 51 of the main controller MC.

Like the exposure completion time t11 of the first preferred embodiment, the exposure completion time t31 may be time data indicating the time when the exposure is completed which is measured by the exposure part EXP and transmitted with the exposure completion signal 71 from the exposure part EXP. Alternatively, the exposure completion time t31 may be the time when the exposure completion signal 71 is received by the main controller MC.

Next, when the cell controller CT5 detects that the exposed substrate W is placed on the substrate rest part PASS10, the fourth main transport mechanism 10D receives the substrate W from the substrate rest part PASS10. Then, the exposed substrate W is supported by the temporary substrate rest part 19 of one of the heating parts PHP of the third thermal processor 31 which is specified by the cell controller CT5.

Subsequently, when the cell controller CT5 detects that the substrate W is supported by the temporary substrate rest part 19 by using a sensor not shown or the like, the local transport mechanism 20 of the specified heating part PHP transports the substrate W from the temporary substrate rest part 19 to the heating plate HP to transfer the substrate W onto the movable support pins 21 raised to the substrate receiving position, whereby the substrate W is located immediately over the heating plate HP.

Next, when a sensor not shown or the like detects that the substrate W is supported on the movable support pins 21 of the heating plate HP, a substrate support completion signal 272 indicating that the substrate W is supported on the movable support pins 21 is transmitted from the heating part PHP to the cell controller CT5. The substrate support completion signal 272 is transmitted through the cell controller CT5 to the main controller MC.

The main controller MC which has recognized from the receipt of the substrate support completion signal 272 that the substrate W is located immediately over the heating plate HP of the heating part PHP transmits a thermal process start instruction signal 273 to the cell controller CT5 at time t32 which is the predetermined time interval T1 later than the exposure completion time t31. The thermal process start instruction signal 273 is transmitted through the cell controller CT5 to the heating part PHP.

The thermal process start instruction signal 273 is a control signal used to trigger the movable support pins 21 to move downwardly from the substrate receiving position to bring the lower surface of the substrate W into contact with the upper surface of the heating plate HP and to trigger the heating plate HP to start the heating process. Thus, the thermal process start instruction signal 273 is used to adjust the timing of the start of the heating process of the substrate W.

As in the first preferred embodiment, the time interval T1 is determined by the type of the resist film, the method of heating in the heating part PHP and the like, and is previously obtained by experiment or the like.

The transmission of the thermal process start instruction signal 273 from the cell controller CT5 to the local transport mechanism 20 causes the downward movement of the movable support pins 21 to bring the lower surface of the substrate W into contact with the upper surface of the heating plate HP, thereby starting the thermal process of the exposed substrate W.

After the heating process by the heating plate HP, the movable support pins 21 move upwardly. Subsequently, the holding plate 24 is moved through the opening 19c into the space between the lower surface of the substrate W and the upper surface of the heating plate HP, and is moved upwardly to receive the substrate W. Then, the holding plate 24 is moved out of the enclosure 27, and is moved upwardly to cause the temporary substrate rest part 19 to support the substrate W. In this process, the substrate W is cooled by the holding plate 24.

The fourth main transport mechanism 10D receives the substrate W supported by the temporary substrate rest part 19, and is moved vertically to the position opposed to the substrate rest parts PASS7 and PASS8 to place the substrate W subjected to the post-exposure heating process onto the lower substrate rest part PASS8. This completes the process of the substrate W in the post-exposure heating processing cell C5.

If the development processing cell C4 cannot perform the development process, the substrate W subjected to the thermal process in the heating part PHP is temporarily stored in the return buffer RBF of the post-exposure heating processing cell C5, as in the first preferred embodiment.

<3.2. Advantages of Substrate Processing Apparatus According to Third Preferred Embodiment>

As described above, the post-exposure heating processing cell C5 according to the third preferred embodiment adjusts the timing of the downward movement of the movable support pins 21 of the heating plate HP. Thus, if there are variations in the time at which each substrate W is supported on the movable support pins 21, the post-exposure heating processing cell C5 can provide substantially the same length of the time interval between the completion of the exposure process and the start of the heating process of each substrate W, and substantially the same length of the time interval between the completion of the exposure process and the start of the cooling process of each substrate W which is subsequent to the above-mentioned heating process. This makes the line widths of the interconnect patterns formed in the resist film substantially the same.

Further, the post-exposure heating processing cell C5 according to the third preferred embodiment can perform the heating process and its subsequent cooling process on substrates W at the time which is the constant predetermined time interval T1 later than the completion of the exposure process. Thus, the chemical reaction due to the acid catalyst created in the resist film is stopped in the same manner for each substrate. This holds the interconnect patterns of the resist film for the respective substrates W substantially the same, as in the first preferred embodiment, even if a substrate W is temporarily stored in the return buffer RBF because it is impossible to feed the substrate W from the post-exposure heating processing cell C5 to the development processing cell C4.

Moreover, as shown in FIGS. 4A and 4B, the temporary substrate rest chamber in which the temporary substrate rest part 19 of the heating part PHP is disposed and the heating chamber in which the heating plate HP is disposed are in vertically stacked relationship, and the temporary substrate rest part 19 and the heating plate HP are vertically isolated from each other. The transfer of substrates W between the temporary substrate rest part 19 and the heating plate HP is carried out only by the local transport mechanism 20. This prevents each substrate W from being influenced by heat from the heating plate HP, as in the first preferred embodiment, thereby to make the line widths of the interconnect patterns formed in the resist film substantially the same.

4. Fourth Preferred Embodiment

A fourth preferred embodiment according to the present invention will be described.

The fourth preferred embodiment is similar to the first preferred embodiment in having a hardware construction similar to that of the substrate processing apparatus 100 of the first preferred embodiment, but is different from the first preferred embodiment in the operation in the post-exposure heating processing cell C5, as in the second and third preferred embodiments. Thus, the operation in the post-exposure heating processing cell C5 will be described below.

<4.1. Operation in Post-Exposure Heating Processing Cell>

Figure 12:
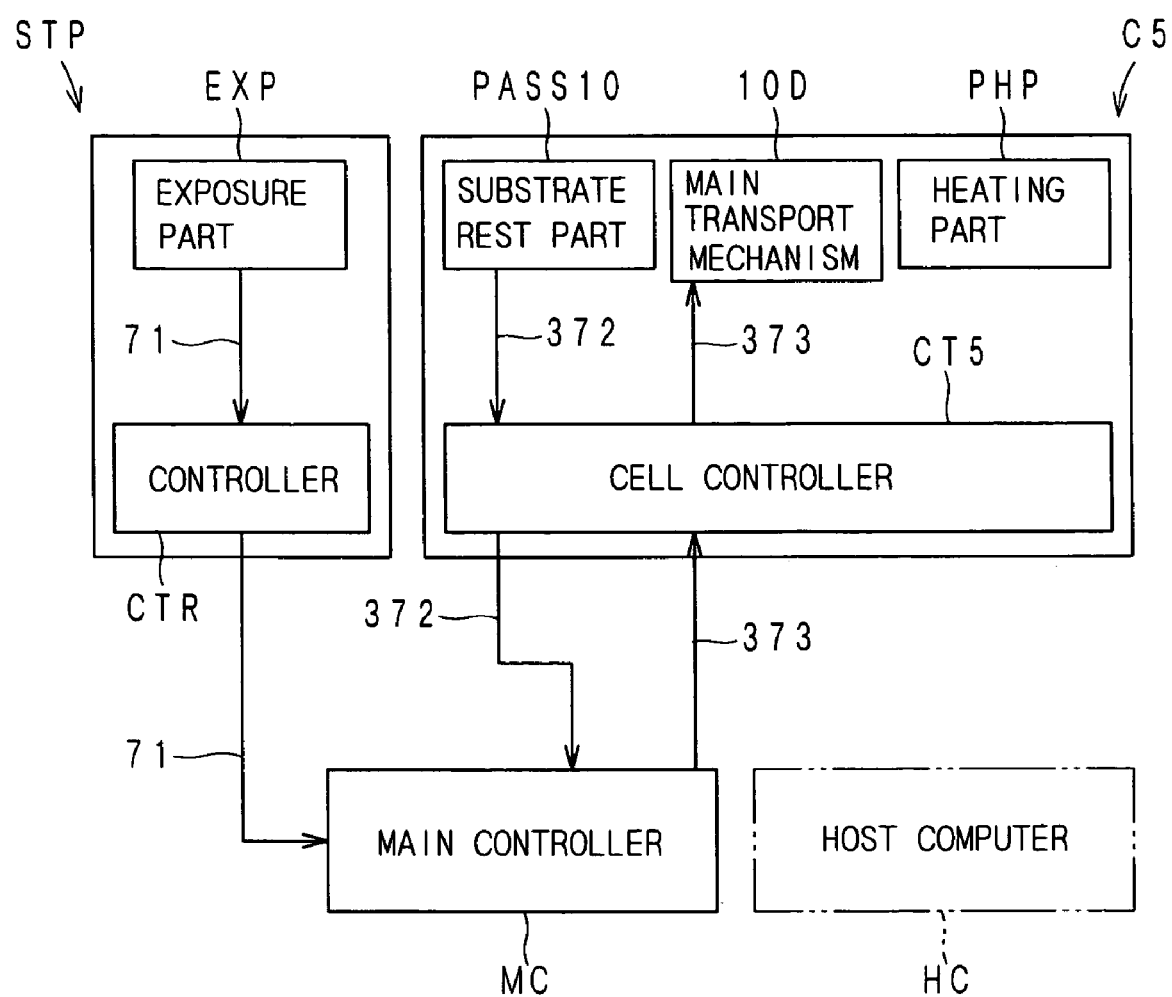
FIG. 12 is a block diagram showing control signals for the exposure apparatus, the post-exposure heating processing cell, and the main controller according to a fourth preferred embodiment of the present invention.

FIG. 12 is a block diagram showing control signals for the exposure apparatus STP, the post-exposure heating processing cell C5 and the main controller MC according to the fourth preferred embodiment.

When movement parameters for vertical movement of the fourth main transport mechanism 10D are constant and the parameters for vertical movement of the local transport mechanism 20 of the heating part PHP are constant, a plurality of substrates W are made substantially the same in the length of the time interval T42 between the start of the transport of each substrate W placed on the substrate rest part PASS10 to the heating part PHP by the fourth main transport mechanism 10D and the start of the heating process of each substrate W by the heating plate HP of the heating part PHP.

In the operation of the post-exposure heating processing cell C5 according to the fourth preferred embodiment, description is given on a technique for controlling the start timing of heating of the substrates W by providing substantially the same length of the time interval between the completion of the exposure process in the exposure apparatus STP and the start of the transport of each substrate W placed on the substrate rest part PASS10 by the fourth main transport mechanism 10D.

After the exposure process of a substrate W in the exposure part EXP included in the exposure apparatus STP, the exposure part EXP transmits the exposure completion signal 71 indicating that the exposure process is completed to the controller CTR. The exposure completion signal 71 is transmitted through the controller CTR to the main controller MC. Then, an exposure completion time t41 is stored in the memory 51 of the main controller MC.

Like the exposure completion time t11 of the first preferred embodiment, the exposure completion time t41 may be time data indicating the time when the exposure is completed which is measured by the exposure part EXP and transmitted with the exposure completion signal 71 from the exposure part EXP. Alternatively, the exposure completion time t41 may be the time when the exposure completion signal 71 is received by the main controller MC.

Next, when the cell controller CT5 detects that the exposed substrate W is placed on the substrate rest part PASS 10, a substrate rest completion signal 372 indicating that the substrate W is placed on the substrate rest part PASS10 is transmitted from the substrate rest part PASS10 to the cell controller CT5. The substrate rest completion signal 372 is transmitted through the cell controller CT5 to the main controller MC.

The main controller MC which has recognized from the receipt of the substrate rest completion signal 372 that the substrate W is placed on the substrate rest part PASS10 transmits a substrate transport instruction signal 373 to the cell controller CT5 at time t42 which is the predetermined time interval T42 later than the exposure completion time t41. The substrate transport instruction signal 373 is transmitted through the cell controller CT5 to the fourth main transport mechanism 10D.

The substrate transport instruction signal 373 is a control signal used to trigger the fourth main transport mechanism 10D to start the transport of the substrate W placed on the substrate rest part PASS10. When the fourth main transport mechanism 10D receives the substrate transport instruction signal 373, the substrate W is taken out of the substrate rest part PASS10 and transported to the heating part PHP by the fourth main transport mechanism 10D. Thus, the substrate transport instruction signal 373 is used to adjust the length of time that the substrate W rests on the substrate rest part PASS10.

The predetermined time interval T42 is obtained by subtracting the time interval T41 between the start of the transport of the substrate W placed on the substrate rest part PASS10 and the start of the heating process of the substrate W by the heating plate HP of the heating part PHP from the time interval T1 between the completion of the exposure process and the start of the heating process by the heating part PHP, that is, T42=T1−T41.

The time interval T1 is determined by the type of the resist film, the method of heating in the heating part PHP and the like, and is previously obtained by experiment or the like. The time interval T41 is also previously obtained by actually operating the fourth main transport mechanism 10D and the local transport mechanism 20 of the heating part PHP.

After the heating process by the heating plate HP of the heating part PHP, the local transport mechanism 20 transports the substrate W to the temporary substrate rest part 19. Then, the fourth main transport mechanism 10D vertically transports the substrate W to place the substrate W onto the substrate rest part PASS8. This completes the process of the substrate W in the post-exposure heating processing cell C5.

If the development processing cell C4 cannot perform the development process, the substrate W subjected to the thermal process in the heating part PHP is temporarily stored in the return buffer RBF of the post-exposure heating processing cell C5, as in the first preferred embodiment.

<4.2. Advantages of Substrate Processing Apparatus According to Fourth Preferred Embodiment>

As described above, the post-exposure heating processing cell C5 according to the fourth preferred embodiment adjusts the length of the time interval during which each substrate W rests on the substrate rest part PASS10. Thus, if there are variations in the time at which each substrate W is placed on the substrate rest part PASS10, the post-exposure heating processing cell C5 can provide substantially the same length of the time interval between the completion of the exposure process and the start of the heating process of each substrate W, and substantially the same length of the time interval between the completion of the exposure process and the start of the cooling process of each substrate W which is subsequent to the above-mentioned heating process. This makes the line widths of the interconnect patterns formed in the resist film substantially the same.

Further, the post-exposure heating processing cell C5 according to the fourth preferred embodiment can perform the heating process and its subsequent cooling process on substrates W at the time which is the constant predetermined time interval T1 later than the completion of the exposure process. Thus, the chemical reaction due to the acid catalyst created in the resist film is stopped in the same manner for each substrate. This holds the interconnect patterns of the resist film for the respective substrates W substantially the same, as in the first preferred embodiment, even if a substrate W is temporarily stored in the return buffer RBF because it is impossible to feed the substrate W from the post-exposure heating processing cell C5 to the development processing cell C4.

Moreover, as shown in FIGS. 4A and 4B, the temporary substrate rest chamber in which the temporary substrate rest part 19 of the heating part PHP is disposed and the heating chamber in which the heating plate HP is disposed are in vertically stacked relationship, and the temporary substrate rest part 19 and the heating plate HP are vertically isolated from each other. The transfer of substrates W between the temporary substrate rest part 19 and the heating plate HP is carried out only by the local transport mechanism 20. This prevents each substrate W from being influenced by heat from the heating plate HP, as in the first preferred embodiment, thereby to make the line widths of the interconnect patterns formed in the resist film substantially the same.

5. Fifth Preferred Embodiment

A fifth preferred embodiment according to the present invention will be described. The fifth preferred embodiment is similar to the first preferred embodiment in having a hardware construction similar to that of the substrate processing apparatus 100 of the first preferred embodiment, but is different from the first preferred embodiment in the operation in the post-exposure heating processing cell C5, as in the second, third and fourth preferred embodiments. Thus, the operation in the post-exposure heating processing cell C5 will be described below.

<5.1. Operation in Post-Exposure Heating Processing Cell>

FIG. 13 is a block diagram showing control signals for the exposure apparatus STP, the post-exposure heating processing cell C5 and the main controller MC according to the fifth preferred embodiment. The fifth preferred embodiment adjusts the movement parameters for vertical movement of the fourth main transport mechanism 10D, to provide substantially the same length of the time interval between the completion of the exposure process and the start of the heating process, thereby controlling the start timing of the heating of substrates W. The operation in the post-exposure heating processing cell C5 according to the fifth preferred embodiment will be described below.

After the exposure process of a substrate W in the exposure part EXP included in the exposure apparatus STP, the exposure part EXP transmits the exposure completion signal 71 indicating that the exposure process is completed to the controller CTR. The exposure completion signal 71 is transmitted through the controller CTR to the main controller MC. Then, an exposure completion time t51 is stored in the memory 51 of the main controller MC.

Like the exposure completion time t11 of the first preferred embodiment, the exposure completion time t51 may be time data indicating the time when the exposure is completed which is measured by the exposure part EXP and transmitted with the exposure completion signal 71 from the exposure part EXP. Alternatively, the exposure completion time t51 may be the time when the exposure completion signal 71 is received by the main controller MC.

Next, when the cell controller CT5 detects that the exposed substrate W is placed on the substrate rest part PASS10, a substrate rest completion signal 472 indicating that the substrate W is placed on the substrate rest part PASS10 is transmitted from the substrate rest part PASS10 to the cell controller CT5.

The substrate rest completion signal 472 is transmitted through the cell controller CT5 to the main controller MC. The main controller MC stores a substrate rest completion time t52 at which the substrate W is placed on the substrate rest part PASS10. Like the exposure completion time t51, the substrate rest completion time t52 may be time data indicating the time when the substrate W is placed on the substrate rest part PASS10 which is transmitted with the substrate rest completion signal 472. Alternatively, the substrate rest completion time t52 may be the time when the substrate rest completion signal 472 is received by the main controller MC.

The main controller MC which has received the substrate rest completion signal 472 computes the movement parameters used for vertical movement of the fourth main transport mechanism 10D to be described later by means of the CPU 52 to transmit the computed movement parameters as a movement setting signal 473 to the cell controller CT5 of the post-exposure heating processing cell C5.

A movement time interval T53 required to move the substrate W held by the fourth main transport mechanism 10D from the position opposed to the substrate rest part PASS10 to the position opposed to the heating part PHP is expressed by $$T53=T1-((t52-t51)+T51+T52) \qquad (2)$$

where T1 is the time interval between the completion of the exposure process and the start of the heating process in the heating part PHP; T51 is a time interval required for the fourth main transport mechanism 10D to receive and hold the substrate W placed on the substrate rest part PASS10; T52 is a time interval required to transfer the substrate W held by the fourth main transport mechanism 10D to the heating part PHP to start the heating process by the heating plate HP of the heating part PHP; t51 is the above-mentioned exposure completion time; and t52 is the above-mentioned substrate rest completion time. As in the first preferred embodiment, the time interval T1 is determined by the type of the resist film, the method of heating in the heating part PHP and the like, and is previously obtained by experiment or the like. The time intervals T51 and T52 are also previously obtained by actually operating the fourth main transport mechanism 10D and the heating part PHP.

Therefore, when the time intervals T1, T51 and T52 are constant, the main controller MC having received the substrate rest completion signal 472 sets the vertical movement parameters (e.g., acceleration time and deceleration time of a motor (not shown) included in the fourth main transport mechanism 10D) of the fourth main transport mechanism 10D so that the vertical movement time of the fourth main transport mechanism 10D is equal to T53, to provide a constant time interval between the exposure completion time t51 and the start of the heating by the heating plate HP of the heating part PHP. The main controller MC also transmits a substrate transport instruction signal 474 giving an instruction to start the movement of the fourth main transport mechanism 10D to the cell controller CT5 simultaneously with the transmission of the movement setting signal 473.

Upon receipt of the movement setting signal 473 and the substrate transport instruction signal 474, the cell controller CT5 sets the vertical movement parameters of the fourth main transport mechanism 10D, based on the movement setting signal 473. The transmission of the substrate transport instruction signal 474 from the cell controller CT5 to the fourth main transport mechanism 10D causes the movement of the substrate W from the substrate rest part PASS10 to the temporary substrate rest part 19 of the heating part PHP. The local transport mechanism 20 transports the substrate W to the heating plate HP of the heating part PHP. Thus, the thermal process of the exposed substrate W is started.

After the heating process by the heating plate HP, the movable support pins 21 move upwardly. Subsequently, the holding plate 24 is moved through the opening 19c into the space between the lower surface of the substrate W and the upper surface of the heating plate HP, and is moved upwardly to receive the substrate W. Then, the holding plate 24 is moved out of the enclosure 27, and is moved upwardly to cause the temporary substrate rest part 19 to support the substrate W. In this process, the substrate W is cooled by the holding plate 24.

The fourth main transport mechanism 10D receives the substrate W supported by the temporary substrate rest part 19, and is moved vertically to the position opposed to the substrate rest parts PASS7 and PASS8 to place the substrate W subjected to the post-exposure heating process onto the lower substrate rest part PASS8. This completes the process of the substrate W in the post-exposure heating processing cell C5.

If the development processing cell C4 cannot perform the development process, the substrate W subjected to the thermal process in the heating part PHP is temporarily stored in the return buffer RBF of the post-exposure heating processing cell C5, as in the first preferred embodiment.

<5.2. Advantages of Substrate Processing Apparatus According to Fifth Preferred Embodiment>

As described above, the post-exposure heating processing cell C5 according to the fifth preferred embodiment adjusts the vertical movement parameters of the fourth main transport mechanism 10D to adjust the movement time interval T53. Thus, if there are variations in the time at which each substrate W is placed on the substrate rest part PASS10, the post-exposure heating processing cell C5 can adjust the transport time interval (movement time interval) during which the substrate W is transported by the fourth main transport mechanism 10D, to provide substantially the same length of the time interval between the completion of the exposure process and the start of the heating process of each substrate W, and substantially the same length of the time interval between the completion of the exposure process and the start of the cooling process of each substrate W which is subsequent to the above-mentioned heating process. This makes the line widths of the interconnect patterns formed in the resist film substantially the same.

Further, the post-exposure heating processing cell C5 according to the fifth preferred embodiment can perform the heating process and its subsequent cooling process on substrates W at the time which is the constant predetermined time interval T1 later than the completion of the exposure process. Thus, the chemical reaction due to the acid catalyst created in the resist film is stopped in the same manner for each substrate. This holds the interconnect patterns of the resist film for the respective substrates W substantially the same, as in the first preferred embodiment, even if a substrate W is temporarily stored in the return buffer RBF because it is impossible to feed the substrate W from the post-exposure heating processing cell C5 to the development processing cell C4.

Moreover, as shown in FIGS. 4A and 4B, the temporary substrate rest chamber in which the temporary substrate rest part 19 of the heating part PHP is disposed and the heating chamber in which the heating plate HP is disposed are in vertically stacked relationship, and the temporary substrate rest part 19 and the heating plate HP are vertically isolated from each other. The transfer of substrates W between the temporary substrate rest part 19 and the heating plate HP is carried out only by the local transport mechanism 20. This prevents each substrate W from being influenced by heat from the heating plate HP, as in the first preferred embodiment, thereby to make the line widths of the interconnect patterns formed in the resist film substantially the same.

<6. Modifications>

Although the preferred embodiments of the present invention have been described hereinabove, the present invention is not limited to the above-mentioned examples.

Based on the operational status data transmitted from the cell controllers CT1 to CT6, the main controller MC in the first to fifth preferred embodiments executes the computational process for obtaining the operational status of the hardware components for optimum substrate processing, and transmits the control signals obtained by the computational process to a selected one of the cell controllers CT1 to CT6, thereby optimizing the operational status of the hardware components included in the cells C1 to C6. The present invention, however, is not limited to this. The host computer HC may receive the operational status data, compute the optimum control signals, and transmit the control signals to the selected one of the cell controllers CT1 to CT6.

While the invention has been described in detail, the foregoing description is in all aspects illustrative and not restrictive. It is understood that numerous other modifications and variations can be devised without departing from the scope of the invention.

What is claimed is:

1. A substrate processing apparatus comprising:
(a) a thermal processor for performing a thermal process on a substrate subjected to an exposure process and including
 (a-1) a temporary substrate rest chamber in which is provided a temporary substrate rest part for placing said substrate thereon when said substrate is transferred to and received from an outside of said thermal processor,
 (a-2) a heating chamber in which is provided a heating unit for heating said substrate subjected to said exposure process, said heating chamber and said temporary substrate rest chamber being disposed in stacked relationship with each other, and
 (a-3) a first transport unit for holding and transporting said substrate between said temporary substrate rest part and said heating unit while cooling said substrate heated by said heating unit; and
(b) a controller configured to cause the start of thermal process of said substrate by said thermal processor when said predetermined time interval has elapsed since the completion of said exposure process by controlling the timing of take out of said substrate from said temporary substrate rest part by said first transport unit and adjusting a time interval during which said substrate rests on said temporary substrate rest part.

2. The substrate processing apparatus according to claim 1, wherein said temporary substrate rest chamber is stacked on top of said heating chamber.

3. A substrate processing apparatus comprising:
a thermal processor
(a) for performing a thermal process on a substrate subjected to an exposure process, and including
(a-1) a temporary substrate rest chamber in which is provided a temporary substrate rest part for placing said substrate thereon when said substrate is transferred to and received from an outside of said thermal processor
(a-2) a heating chamber in which is provided a heating unit for heating said substrate subjected to said exposure process, said heating chamber and said temporary substrate rest chamber being disposed in stacked relationship with each other, and
(a-3) a first transport unit for holding and transporting said substrate between said temporary substrate rest part and said heating unit while cooling said substrate heated by said heating unit; and
(b) a controller configured to cause the start of thermal process of said substrate by said thermal processor when said predetermined time interval has elapsed since the completion of said exposure process by setting movement parameters of said first transport unit and adjusting a time interval during which said substrate taken out from said temporary substrate rest part is transported to said heating unit.

4. The substrate processing apparatus according to claim 3, wherein
said temporary substrate rest part is stacked on top of said heating chamber.

5. The substrate processing apparatus according to claim 1, wherein
said heating unit includes
a plurality of movable support pins extendable out of and retractable into an upper surface of said heating unit for supporting said substrate, and
said controller controls the timing of retraction of said plurality of movable support pins into the heating unit, thereby to control the start timing of said thermal process.

6. The substrate processing apparatus according to claim 1, further comprising:
(c) a substrate transfer part for transfer of a substrate between said exposure part and said thermal processor; and
(d) a second transport unit for transporting said substrate between said substrate transfer part and said thermal processor.

* * * * *